United States Patent
Okada et al.

(10) Patent No.: US 12,332,529 B2
(45) Date of Patent: Jun. 17, 2025

(54) ACTIVE MATRIX SUBSTRATE AND LIQUID CRYSTAL DISPLAY APPARATUS

(71) Applicant: Sharp Display Technology Corporation, Kameyama (JP)

(72) Inventors: Kuniaki Okada, Kameyama (JP); Atsushi Hachiya, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 0 days.

(21) Appl. No.: 18/712,249

(22) PCT Filed: Nov. 11, 2022

(86) PCT No.: PCT/JP2022/042039
§ 371 (c)(1),
(2) Date: May 21, 2024

(87) PCT Pub. No.: WO2023/090264
PCT Pub. Date: May 25, 2023

(65) Prior Publication Data
US 2025/0013111 A1    Jan. 9, 2025

(30) Foreign Application Priority Data

Nov. 22, 2021   (JP) ................................ 2021-189606

(51) Int. Cl.
*G02F 1/1368*   (2006.01)
*G02F 1/1362*   (2006.01)
(Continued)

(52) U.S. Cl.
CPC .... *G02F 1/13685* (2021.01); *G02F 1/136209* (2013.01); *G02F 1/136286* (2013.01);
(Continued)

(58) Field of Classification Search
CPC .......... G02F 1/13685; G02F 1/136209; G02F 1/136286; G02F 1/136227; G02F 1/1368;
(Continued)

(56) References Cited

U.S. PATENT DOCUMENTS

2012/0138922 A1   6/2012   Yamazaki et al.
2013/0320334 A1   12/2013  Yamazaki et al.
(Continued)

FOREIGN PATENT DOCUMENTS

JP   H11-038440 A    2/1999
JP   2012-134475 A   7/2012
(Continued)

*Primary Examiner* — Kevin Quarterman
(74) *Attorney, Agent, or Firm* — ScienBiziP, P.C.

(57) ABSTRACT

An active matrix substrate includes, in order, a pixel TFT including an oxide semiconductor layer, a first interlayer insulating layer covering the oxide semiconductor layer and a gate electrode, a first organic insulating layer, and a pixel electrode. A first pixel contact hole is formed in the first interlayer insulating layer, and a second pixel contact hole is formed in the first organic insulating layer. The pixel electrode is made of a transparent conductive material, a first electrode layer includes a first portion in contact with a drain contact region of the oxide semiconductor layer in the first pixel contact hole and a second portion located in the second pixel contact hole, a second electrode layer includes a third portion in contact with the second portion and a fourth portion located on the first organic insulating layer, and a third electrode layer includes a fifth portion in contact with the fourth portion and a sixth portion located on the second organic insulating layer. A length of the second electrode layer in a row direction is less than or equal to a length of the third electrode layer in the row direction. The active matrix substrate further includes a second organic insulating layer filling the second pixel contact hole.

11 Claims, 13 Drawing Sheets

(51) Int. Cl.
*H10D 86/40* (2025.01)
*H10D 86/60* (2025.01)

(52) U.S. Cl.
CPC ......... *H10D 86/423* (2025.01); *H10D 86/441* (2025.01); *H10D 86/60* (2025.01)

(58) Field of Classification Search
CPC .... H10D 86/423; H10D 86/441; H10D 86/60; H10D 30/021; H10D 30/67; G09F 9/00; G09F 9/30; G09F 9/35
See application file for complete search history.

(56) References Cited

U.S. PATENT DOCUMENTS

2014/0286076 A1    9/2014   Aoki et al.
2020/0387038 A1*   12/2020   Itou ..................... H10D 86/411

FOREIGN PATENT DOCUMENTS

| JP | 2014-007399 A | 1/2014 |
| JP | 2014-209727 A | 11/2014 |
| JP | 2019-152744 A | 9/2019 |

* cited by examiner

ACTIVE MATRIX SUBSTRATE AND LIQUID CRYSTAL DISPLAY APPARATUS

TECHNICAL FIELD

The present invention relates to an active matrix substrate and a liquid crystal display apparatus.

BACKGROUND ART

Currently, liquid crystal display apparatuses including an active matrix substrate are widely used for various purposes. The active matrix substrate has a switching element for each pixel region. An active matrix substrate having a thin-film transistor (TFT) as the switching element is called a TFT substrate.

The TFT substrate includes a TFT and a pixel electrode that are provided for each pixel region, a gate line that supplies a gate signal to the TFT, and a source line that supplies a source signal to the TFT. A gate electrode, a source electrode, and a drain electrode of the TFT are electrically connected to the gate line, the source line, and the pixel electrode, respectively. The TFT is covered by an interlayer insulating layer (passivation layer).

On the interlayer insulating layer, an organic insulating layer may be formed as a flattening layer for flattening a surface. By forming the organic insulating layer, it is also possible to reduce load capacitance (parasitic capacitance) to reduce power consumption. As the material of the organic insulating layer, a photosensitive resin material is typically used. When the organic insulating layer is formed, the pixel electrode is provided on the organic insulating layer, and thus the pixel electrode is connected to the drain electrode of the TFT in a contact hole that is formed in the organic insulating layer and the like.

CITATION LIST

Patent Literature

PTL1: Japanese Unexamined Patent Application Publication No. 2019-152744

SUMMARY OF INVENTION

Technical Problem

In order to obtain a sufficient flattening effect and a sufficient load-capacitance-reducing effect, a photosensitive resin material is applied thickly (for example, with a thickness of several μm) when forming the organic insulating layer. Therefore, in order to form the contact hole so that an underlying layer of the organic insulating layer is reliably exposed, it is necessary to provide the photosensitive resin material with sufficient light-exposure energy to sufficiently expose the photosensitive resin material to light. To be specific, by increasing the light exposure time or increasing the size of a mask pattern, light exposure is performed so that a region to be removed by photolithography is more reliably exposed to light. Therefore, in order to form the contact hole stably (so that the underlying layer is exposed more reliably), it is inevitable to form the contact hole to have a large finished diameter.

Since the orientations of liquid crystal molecules are misaligned and light leakage occurs in the vicinity of the contact hole, the contact hole may cause decrease of contrast ratio and display quality. When a light-blocking layer that optically shields the vicinity of the contact hole is provided, although it may be possible to suppress decrease of contrast ratio and display quality, transmittance (use efficiency of light) undesirably decreases, because a region that contributes to display in the pixel region becomes small by the area of the light-blocking layer. The definition of liquid crystal display apparatuses has increased in recent years, and, since the proportion of an area occupied by the contact hole in the pixel region is large in a high definition (for example, 1000 ppi or higher) liquid crystal display apparatus, such as a liquid crystal display apparatus for a head-mounted display, the decrease of transmittance is significant.

PTL 1 discloses a pixel structure that is suitable for increasing the definition of a display apparatus. With the pixel structure disclosed in PTL 1, since the drain electrode (called a "pedestal" in PTL 1) of a TFT is formed in a layer different from that of a source line, it is possible to arrange source lines at a narrow pitch.

However, even when the pixel structure disclosed in PTL 1 is used, it is necessary to optically shield the vicinity of a contact hole formed in an organic insulating layer because the vicinity of the contact hole may cause light leakage. Therefore, decrease of transmittance due to the contact hole formed in the organic insulating layer has not been suppressed yet.

The present invention has been made in consideration of the problem described above, and an object thereof is to provide an active matrix substrate in which decrease of transmittance due to a contact hole formed in an organic insulating layer is suppressed.

Solution to Problem

The present description discloses an active matrix substrate, a liquid crystal display apparatus, and a method of manufacturing an active matrix substrate described in the following items.

Item 1

An active matrix substrate having a plurality of pixel regions that are arranged in a matrix pattern including a plurality of rows and a plurality of columns, comprising:
  a substrate;
  a pixel TFT that is supported by the substrate and provided in correspondence with each of the plurality of pixel regions, the pixel TFT including an oxide semiconductor layer including a channel region and a source contact region and a drain contact region that are located on both sides of the channel region, a gate insulating layer that is provided on the channel region of the oxide semiconductor layer, a gate electrode that is provided on the gate insulating layer and faces the channel region with the gate insulating layer therebetween, and a source electrode that is electrically connected to the source contact region;
  a gate line that extends in a row direction and supplies a gate signal to the pixel TFT;
  a source line that extends in a column direction and supplies a source signal to the pixel TFT;
  a light-blocking layer that is located between the substrate and the oxide semiconductor layer and faces at least the channel region of the oxide semiconductor layer;
  a first interlayer insulating layer that is provided so as to cover the oxide semiconductor layer and the gate electrode;

a first organic insulating layer that is located on the first interlayer insulating layer and provided so as to cover the pixel TFT; and a pixel electrode that includes a portion located on the first organic insulating layer and is electrically connected to the pixel TFT, wherein, at least in the first interlayer insulating layer, a first pixel contact hole is formed so that at least a part of the drain contact region is exposed, wherein, in the first organic insulating layer, a second pixel contact hole is formed so as to at least partially overlap at least one of the gate line and the light-blocking layer when seen in a normal direction of the substrate, wherein the pixel electrode includes a first electrode layer, a second electrode layer, and a third electrode layer each of which is formed from a transparent conductive material, wherein the first electrode layer, the second electrode layer, and the third electrode layer are arranged in this order from the substrate side and electrically connected to each other, wherein the first electrode layer includes a first portion that is in contact with the drain contact region of the oxide semiconductor layer in the first pixel contact hole and a second portion that is located in the second pixel contact hole, wherein the second electrode layer includes a third portion that is in contact with the second portion of the first electrode layer in the second pixel contact hole and a fourth portion that is located on the first organic insulating layer, wherein the active matrix substrate further includes a second organic insulating layer that is formed so as to fill the second pixel contact hole and covers the third portion of the second electrode layer, wherein the third electrode layer includes a fifth portion that is in contact with the fourth portion of the second electrode layer and a sixth portion that is located on the second organic insulating layer, and wherein a length of the second electrode layer in the row direction is less than or equal to a length of the third electrode layer in the row direction.

Item 2

The active matrix substrate according to Item 1, wherein the length of the second electrode layer in the row direction is less than the length of the third electrode layer in the row direction, and wherein, when seen in the normal direction of the substrate, both ends of the second electrode layer in the row direction are located further inward than both ends of the third electrode layer in the row direction.

Item 3

The active matrix substrate according to Item 1, wherein the length of the second electrode layer in the row direction is substantially the same as the length of the third electrode layer in the row direction, and wherein, when seen in the normal direction of the substrate, positions of both ends of the second electrode layer in the row direction are substantially the same as positions of both ends of the third electrode layer in the row direction.

Item 4

The active matrix substrate according to Item 3, wherein the second electrode layer and the third electrode layer are formed from the same transparent conductive material.

Item 5

The active matrix substrate according to any one of Items 1 to 4, wherein the first organic insulating layer is a color filter layer.

Item 6

The active matrix substrate according to any one of Items 1 to 5, wherein, when any two pixel regions, among the plurality of pixel regions, that are adjacent to each other in the column direction are referred to as a first pixel region and a second pixel region, the pixel TFT corresponding to the first pixel region is referred to as a first pixel TFT, and the pixel TFT corresponding to the second pixel region is referred to as a second pixel TFT, the second electrode layer of the pixel electrode that is electrically connected to the first pixel TFT extends in the column direction from an inside of the second pixel contact hole corresponding to the first pixel TFT toward the second pixel region side when seen in the normal direction of the substrate, and an end of the second electrode layer on the second pixel region side is covered by the second organic insulating layer in the second pixel contact hole corresponding to the second pixel TFT.

Item 7

The active matrix substrate according to any one of Items 1 to 6, wherein, when any two pixel regions, among the plurality of pixel regions, that are adjacent to each other in the column direction are referred to as a first pixel region and a second pixel region, the pixel TFT corresponding to the first pixel region is referred to as a first pixel TFT, and the pixel TFT corresponding to the second pixel region is referred to as a second pixel TFT, one end, in the column direction, of the third electrode layer of the pixel electrode that is electrically connected to the first pixel TFT at least partially overlaps at least one of the gate line and the light-blocking layer corresponding to the first pixel TFT when seen in the normal direction of the substrate, and the other end, in the column direction, of the third electrode layer of the pixel electrode that is electrically connected to the first pixel TFT at least partially overlaps at least one of the gate line and the light-blocking layer corresponding to the second pixel TFT when seen in the normal direction of the substrate.

Item 8

The active matrix substrate according to any one of Items 1 to 7, wherein, in the first interlayer insulating layer, a source contact hole is formed so that at least a part of the source contact region of the oxide semiconductor layer is exposed, wherein the source electrode is formed on the first interlayer insulating layer and in the source contact hole, and wherein the active matrix substrate further includes a second interlayer insulating layer that is located between the first interlayer insulating layer and the first organic insulating layer and covers the source electrode.

Item 9

The active matrix substrate according to any one of Items 1 to 8, wherein the oxide semiconductor layer includes an In—Ga—Zn—O-based semiconductor.

Item 10

A liquid crystal display apparatus comprising:
the active matrix substrate according to any one of Items 1 to 9;
a counter substrate that is provided so as to face the active matrix substrate; and
a liquid crystal layer that is provided between the active matrix substrate and the counter substrate.

Item 11

A method of manufacturing the active matrix substrate according to Item 3 or 4, comprising:
a step (A) of forming the pixel TFT on the substrate;
a step (B) of forming the first electrode layer by depositing a first transparent conductive film after the step (A) and subsequently performing patterning of the first transparent conductive film;
a step (C) of forming the first organic insulating layer that covers the pixel TFT and the first electrode layer and has the second pixel contact hole;
a step (D) of depositing a second transparent conductive film on the first organic insulating layer and in the second pixel contact hole and subsequently performing patterning of the second transparent conductive film;
a step (E) of forming the second organic insulating layer so as to fill the second pixel contact hole after the step (D); and
a step (F) of forming the third electrode layer and the second electrode layer by, after depositing a third transparent conductive film on the second transparent conductive film, on the first organic insulating layer, and on the second organic insulating layer, performing patterning of the third transparent conductive film and additional patterning of the second transparent conductive film simultaneously.

Advantageous Effects of Invention

With an embodiment of the present invention, it is possible to provide an active matrix substrate in which decrease of transmittance due to a contact hole formed in an organic insulating layer is suppressed.

DESCRIPTION OF EMBODIMENTS

Hereafter, embodiments of the present invention will be described with reference to the drawings. Although an example of an active matrix substrate for a liquid crystal display apparatus of an FFS (Fringe Field Switching) mode will be described below as an embodiment of the present invention, the present invention is not limited to the embodiment described below.

First Embodiment

Figure 1:
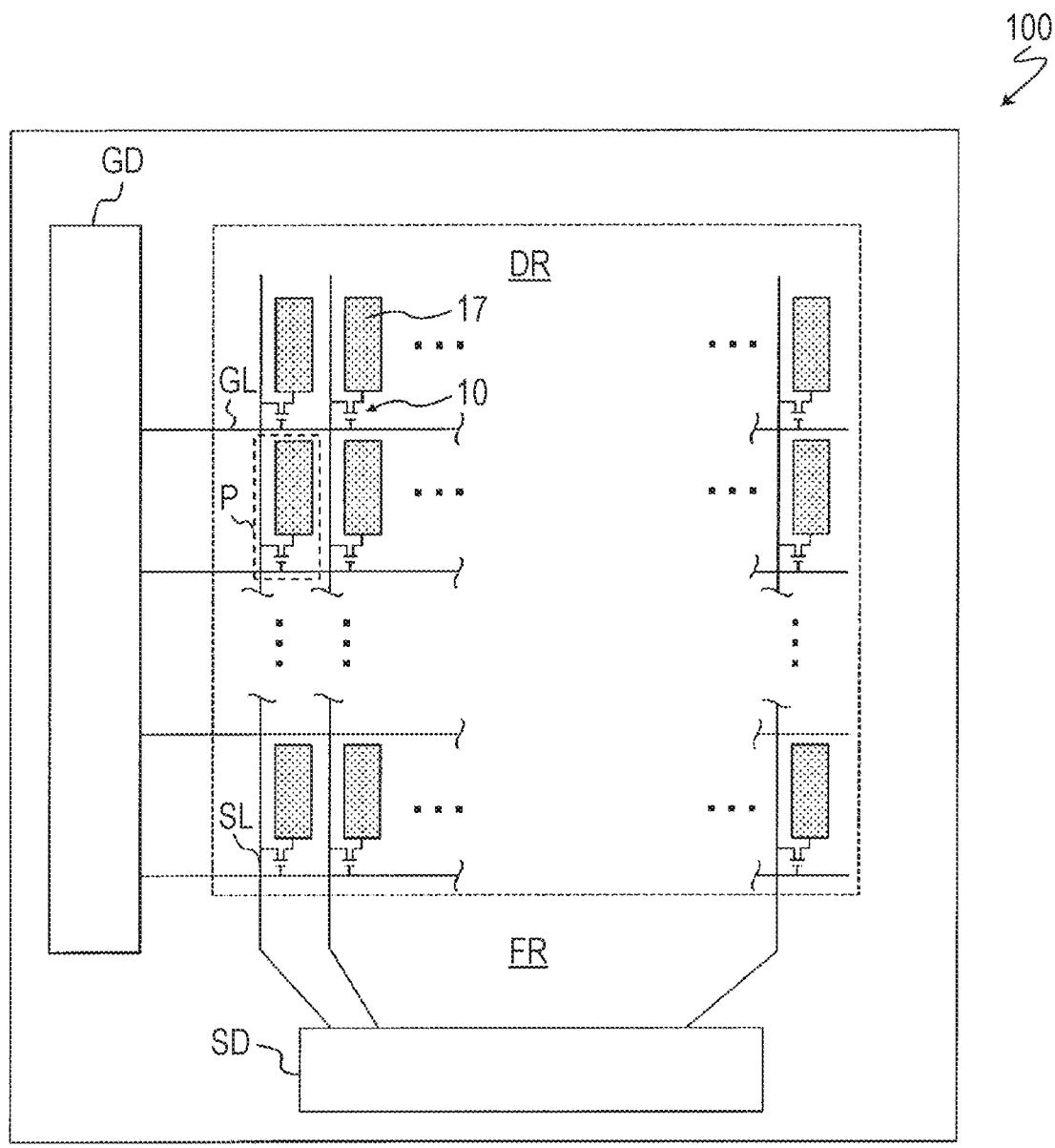
FIG. 1 is a schematic view illustrating an example of the planar structure of an active matrix substrate 100 according to an embodiment of the present invention.

Referring to FIG. 1, an active matrix substrate 100 in the present embodiment will be described. FIG. 1 is a schematic view illustrating an example of the planar structure of the active matrix substrate 100.

As illustrated in FIG. 1, the active matrix substrate 100 has a display region DR and a non-display region (also referred to as a "frame region") FR. The display region DR is defined by a plurality of pixel regions P. The plurality of pixel regions P are arranged in a matrix pattern including a plurality of rows and a plurality of columns. The pixel regions P are regions corresponding to the pixels of a liquid crystal display apparatus, and the pixel regions P may be simply referred to as "pixels". The non-display region FR is a region that is located around the display region DR and that does not contribute to display.

In the display region DR, a plurality of gate lines GL extending in the row direction and a plurality of source lines SL extending in the column direction are formed. Each pixel region P is, for example, a region that is surrounded by a pair of gate lines GL that are adjacent to each other and a pair of source lines SL that are adjacent to each other.

Peripheral circuits are disposed in the non-display region FR. Here, in the non-display region FR, a gate driver GD that drives the gate lines GL is integrally (monolithically) formed, and a source driver SD that drives the source lines SL is mounted. In the non-display region FR, a source switching (Source Shared Driving: SSD) circuit that drives source bus lines SL by time-sharing may be additionally disposed, and an SSD circuit and the like may be integrally formed in the same way as the gate driver GD.

Moreover, in the display region DR, a thin-film transistor (TFT) 10, which is provided in correspondence with each pixel region P, and a pixel electrode 17, which is electrically connected to the TFT 10, are disposed. Hereafter, the TFT 10 will be referred to as a "pixel TFT". The pixel TFT 10 receives a gate signal (scan signal) from a corresponding gate line GL and receives a source signal (display signal) from a corresponding source line SL.

Figure 2:
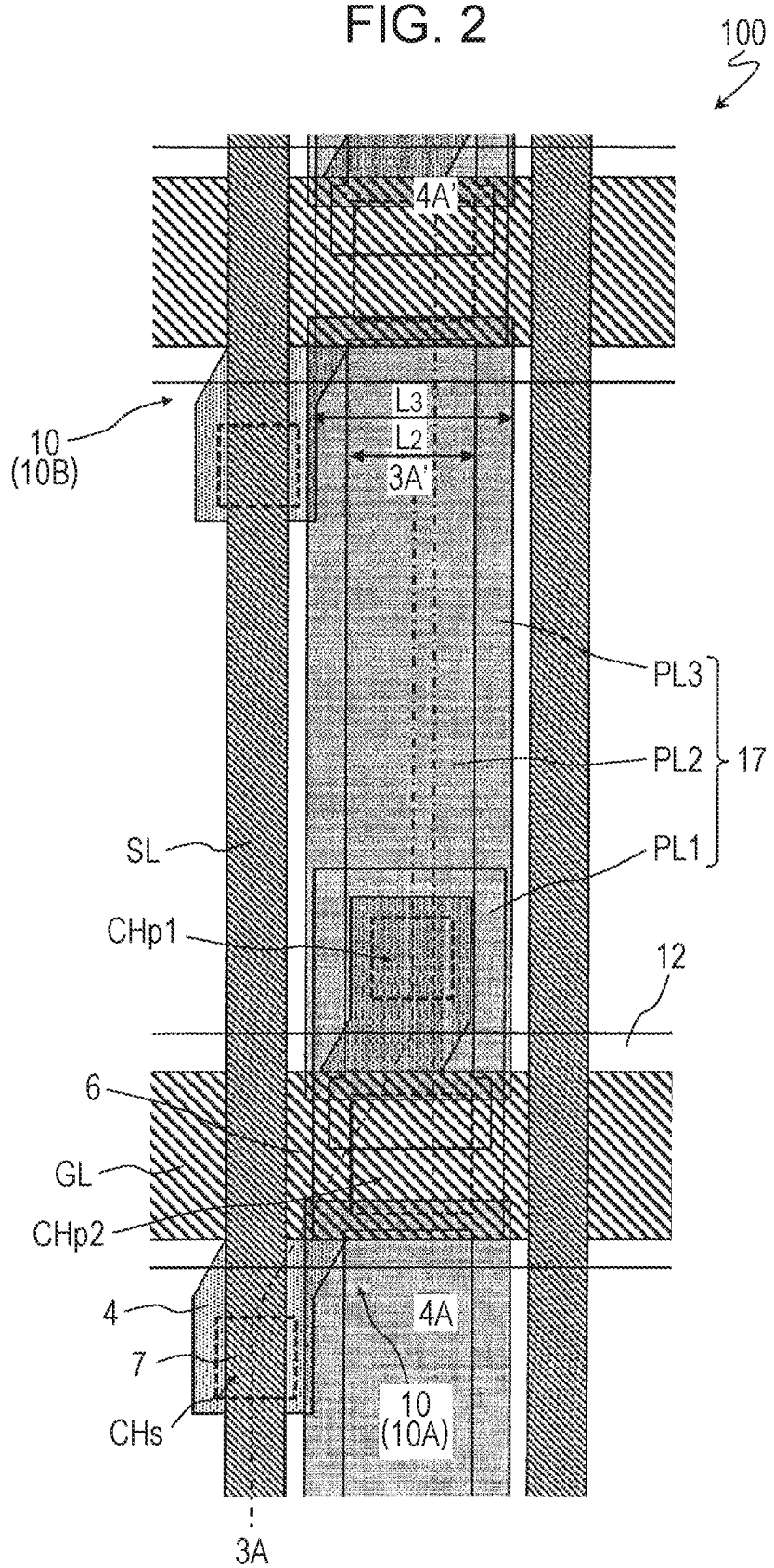
FIG. 2 is a plan view schematically illustrating the active matrix substrate 100.
Figure 3:
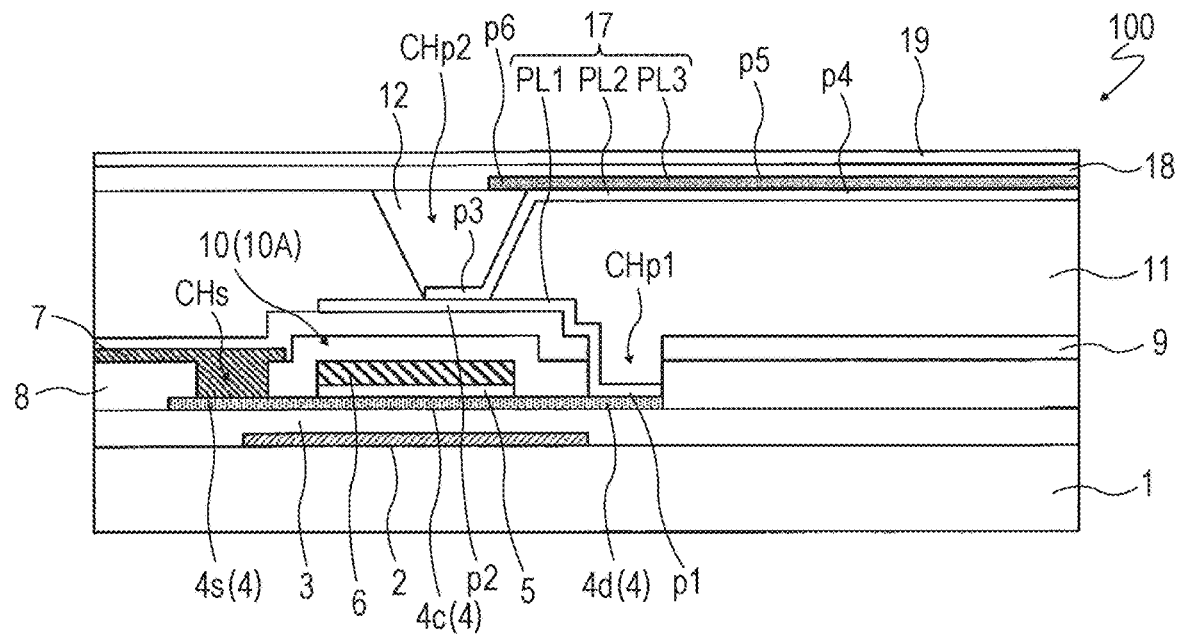
FIG. 3 is a sectional view schematically illustrating the active matrix substrate 100, illustrating a section taken along line 3A-3A' in FIG. 2.
Figure 4:
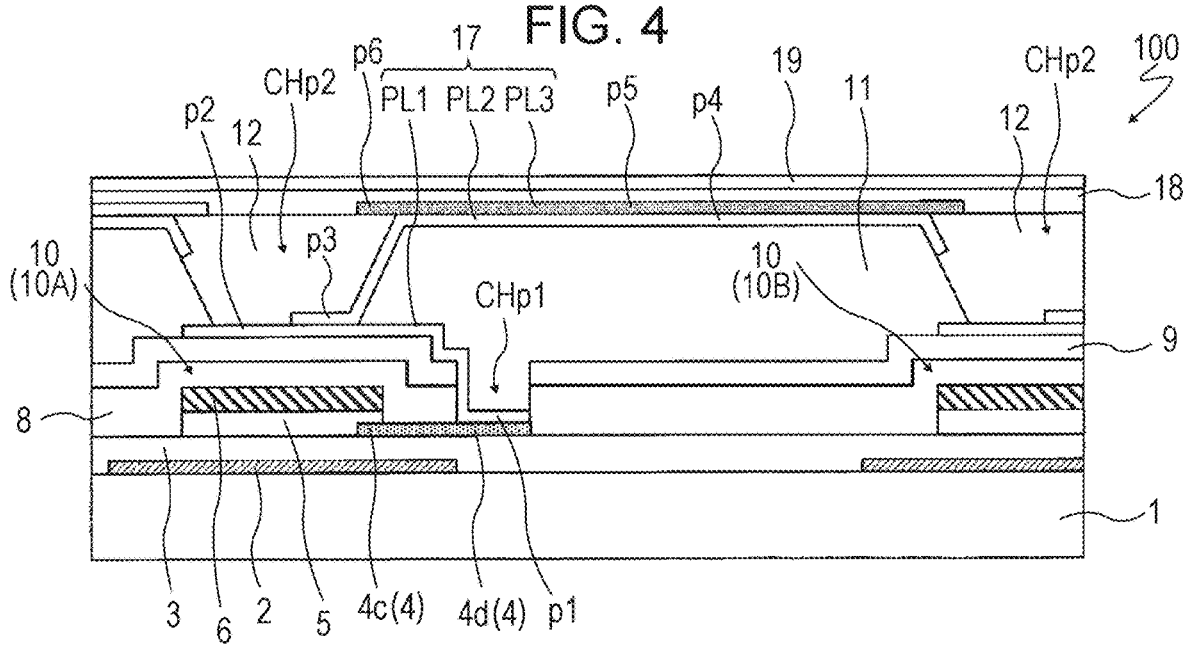
FIG. 4 is a sectional view schematically illustrating the active matrix substrate 100, illustrating a section taken along line 4A-4A' in FIG. 2.

Next, referring to FIGS. 2, 3, and 4, more specific configurations of the active matrix substrate 100 will be described. FIG. 2 is a plan view schematically illustrating the active matrix substrate 100. FIGS. 3 and 4 are sectional views schematically illustrating the active matrix substrate 100, respectively illustrating sections taken along line 3A-3A' and 4A-4A' in FIG. 2.

As illustrated in FIGS. 2, 3, and 4, the active matrix substrate 100 includes a substrate 1, the pixel TFT 10 supported by the substrate 1, a first organic insulating layer (flattening layer) 11 provided so as to cover the pixel TFT 10, and the pixel electrode 17 including a portion that is located on the first organic insulating layer 11.

The substrate 1 is transparent and has an insulating property. The substrate 1 is, for example, a glass substrate or a plastic substrate.

A light-blocking layer 2 is provided on the substrate 1. A lower insulating layer 3 is provided so as to cover the light-blocking layer 2.

The pixel TFT 10 is provided in correspondence with each pixel region P. The pixel TFT 10 includes an oxide semiconductor layer 4, a gate insulating layer 5, a gate electrode 6, and a source electrode 7. The pixel TFT 10 has a top gate structure.

The oxide semiconductor layer 4 is provided on the lower insulating layer 3. The oxide semiconductor layer 4 includes a channel region 4c, a source contact region 4s located on both sides of the channel region 4c, and a drain contact region 4d. The oxide semiconductor layer 4 is formed from a transparent oxide semiconductor material. The light-blocking layer 2 is located between the oxide semiconductor layer 4 and the substrate 1 and faces at least the channel region 4c of the oxide semiconductor layer 4.

In the example illustrated in the figures, the oxide semiconductor layer 4 is formed so that one end portion thereof overlaps a source line SL and the other end portion thereof is located at substantially the center between two source lines SL. A portion of the oxide semiconductor layer 4 connecting one end portion and the other end portion extends so as to cross a gate line GL diagonally (in a direction inclined with respect to the column direction). The resistances of the source contact region 4s and the drain contact region 4d of the oxide semiconductor layer 4 are made lower than that of the channel region 4c (a region overlapping the gate line GL).

The gate insulating layer 5 is provided on the channel region 4c of the oxide semiconductor layer 4. The gate electrode 6 is provided on the gate insulating layer 5 and faces the channel region 4c of the oxide semiconductor layer 4 with the gate insulating layer 5 therebetween. The gate electrode 6 is electrically connected to a corresponding gate line GL. In the example illustrated in the figures, a part of the gate line GL (to be specific, a portion facing the oxide semiconductor layer 4) functions as the gate electrode 6.

A first interlayer insulating layer 8 is provided so as to cover the gate electrode 6 and the oxide semiconductor layer 4. The source electrode 7 is provided on the first interlayer insulating layer 8. In the first interlayer insulating layer 8, a contact hole (hereafter, referred to as a "source contact hole") CHs is formed so that at least a part of the source contact region 4s of the oxide semiconductor layer 4 is exposed. The source electrode 7 is formed on the first interlayer insulating layer 8 and in the source contact hole CHs, is in contact with the source contact region 4s in the source contact hole CHs, and is electrically connected to the source contact region 4s. The source electrode 7 is electrically connected to a corresponding source line SL. In the example illustrated in the figures, a part of the source line SL functions as the source electrode 7.

A second interlayer insulating layer 9 is provided so as to cover the pixel TFT 10. The second interlayer insulating layer 9 is located between the first interlayer insulating layer 8 and the first organic insulating layer 11 and covers the source electrode 7. In the second interlayer insulating layer 9 and the first interlayer insulating layer 8, a first pixel contact hole CHp1 is formed so that at least a part of the drain contact region 4d of the oxide semiconductor layer 4 is exposed.

The first organic insulating layer 11 is formed on the second interlayer insulating layer 9 (naturally so as to be located above the first interlayer insulating layer 8). The first organic insulating layer 11 is formed from, for example, a photosensitive resin material. A second pixel contact hole CHp2 is formed in the first organic insulating layer 11. The second pixel contact hole CHp2 is formed so as to at least partially overlap at least one (here, both) of the gate line GL and the light-blocking layer 2 when seen in the normal direction of the substrate 1.

The pixel electrode 17 includes a portion that is located on the first organic insulating layer 11. In the present embodiment, the pixel electrode 17 includes a first electrode layer (lower electrode layer) PL1, a second electrode layer (middle electrode layer) PL2, and a third electrode layer (upper electrode layer) PL3, each of which is formed from a transparent conductive material. The first electrode layer PL1, the second electrode layer PL2, and the third electrode layer PL3 are arranged in this order from the substrate 1 side. The first electrode layer PL1, the second electrode layer PL2, and the third electrode layer PL3 are electrically connected to each other.

The first electrode layer PL1 is formed on the second interlayer insulating layer 9 and in the first pixel contact hole CHp1. The first electrode layer PL1 includes a portion (hereafter, referred to as a "first portion") p1 that is in contact with the drain contact region 4d of the oxide semiconductor layer 4 in the first pixel contact hole CHp1 and a portion (hereafter, referred to as a "second portion") p2 that is located in the second pixel contact hole CHp2. The first electrode layer PL1 functions as a connection electrode that electrically connects the drain contact region 4d of the oxide semiconductor layer 4 and the second electrode layer PL2.

The second electrode layer PL2 is formed on the first organic insulating layer 11 and in the second pixel contact hole CHp2. The second electrode layer PL2 includes a portion (hereafter, referred to as a "third portion") p3 that is in contact with the second portion p2 of the first electrode layer PL1 in the second pixel contact hole CHp2 and a portion (hereafter, referred to as a "fourth portion") p4 that is located on the first organic insulating layer 11. The second electrode layer PL2 functions as a connection electrode that electrically connects the first electrode layer PL1 and the third electrode layer PL3.

The active matrix substrate 100 of the present embodiment further includes a second organic insulating layer 12 that is formed so as to fill the second pixel contact hole CHp2. The second organic insulating layer 12 covers the third portion p3 of the second electrode layer PL2. The second organic insulating layer 12 is formed from, for example, a photosensitive resin material.

The third electrode layer PL3 is formed on the first organic insulating layer 11, on the second electrode layer PL2, and on the second organic insulating layer 12. The third electrode layer PL3 includes a portion (hereafter, referred to as a "fifth portion") p5 that is in contact with the fourth portion p4 of the second electrode layer PL2 and a portion (hereafter, referred to as a "sixth portion") p6 that is located on the second organic insulating layer 12.

The length L2 (see FIG. 2) of the second electrode layer PL2 in the row direction is less than or equal to the length $L_3$ (see FIG. 2) of the third electrode layer PL3 in the row direction. To be more specific, as illustrated in FIG. 2, the length $L_2$ of the second electrode layer PL2 in the row direction is less than the length $L_3$ of the third electrode layer PL3 in the row direction. When seen in the normal direction of the substrate 1, both ends of the second electrode layer PL2 in the row direction are located further inward than both ends of the third electrode layer PL3 in the row direction.

A dielectric layer 18 is provided so as to cover the pixel electrode 17. On the dielectric layer 18, a common electrode 19 that faces the pixel electrode 17 is provided. Although not illustrated here, at least one slit is formed in the common electrode 19 for each pixel region P.

As described above, since the active matrix substrate 100 in the present embodiment includes the second organic insulating layer 12 that is formed so as to fill the second pixel contact hole CHp2, a step due to the second pixel contact hole CHp2 is flattened, and occurrence of misalignment of liquid crystal molecules caused by the second pixel contact hole CHp2 is suppressed. Therefore, since it is not necessary to optically shield the second pixel contact hole CHp2 and the vicinity thereof and it is possible to use a region on the second pixel contact hole CHp2 and the vicinity thereof as an opening (a region that contributes to display), transmittance can be improved. Since the first electrode layer PL1, the second electrode layer PL2, and the third electrode layer PL3 included in the pixel electrode 17 are each formed from a transparent conductive material, decrease of transmittance due to inclusion of these electrode layers by the pixel electrode 17 does not occur substantially. Moreover, since the first electrode layer PL1, which includes the portion (first portion) p1 that is in contact with the drain contact region 4d of the oxide semiconductor layer 4, is formed from a transparent conductive material and thereby it is possible to use a region on the first pixel contact hole CHp1 (that is, a region around the drain contact region 4d) also as an opening, transmittance can be further improved.

In the active matrix substrate 100 in the present embodiment, the length $L_2$ of the second electrode layer PL2 in the row direction is less than the length $L_3$ of the third electrode layer PL3 in the row direction, and both ends of the second electrode layer PL2 in the row direction are located further inward than both ends of the third electrode layer PL3 in the row direction. Thus, generation of unnecessary parasitic capacitance can be suppressed. For example, in a case where the length $L_2$ of the second electrode layer PL2 in the row direction is the same as the length $L_3$ of the third electrode layer PL3 in the row direction, if the second electrode layer PL2 protrudes from the third electrode layer PL3 due to misalignment between the second electrode layer PL2 and the third electrode layer PL3, the width (length in the row direction) of the pixel electrode 17 may become greater than the width (length $L_3$ in the row direction) of the third electrode layer PL3. In this case, since the parasitic capacitance between the pixel electrode 17 and source line SL increases, there is a concern that, for example, crosstalk may become worse. In contrast, with the active matrix substrate 100 of the present embodiment, since both ends of the second electrode layer PL2 in the row direction are located further inward than both ends of the third electrode layer PL3 in the row direction, even if misalignment occurs between the second electrode layer PL2 and the third electrode layer PL3, it is possible to suppress protrusion of both ends of the second electrode layer PL2 from both ends of the third electrode layer PL3. Therefore, generation of unnecessary parasitic capacitance is suppressed. The difference between the length $L_2$ of the second electrode layer PL2 in the row direction and the length $L_3$ of the third electrode layer PL3 in the row direction is set in accordance with a misalignment amount that is assumed. For example, the length $L_2$ of the second electrode layer PL2 in the row direction is set to be less than the length $L_3$ of the third electrode layer PL3 in the row direction by 1 μm or greater.

Moreover, in the present embodiment, since the third electrode layer PL3 includes the portion (sixth portion) p6 that is located on the second organic insulating layer 12, a region in which the distance between the pixel electrode 17 and the common electrode 19 is maintained to be constant becomes large, and a region where a fringing electric field having a sufficient strength is generated becomes large, and also thereby transmittance is improved.

Here, any two pixel regions P, among the plurality of pixel regions P, that are adjacent to each other in the column direction will be referred to as a "first pixel region" and a "second pixel region". For example, a pixel region P whose entirety is illustrated in FIG. 2 will be referred to as a first pixel region, and a pixel region P that is located above the first pixel region in the figure will be referred to as a second pixel region. A pixel TFT 10A corresponding to the first pixel region will be referred to as a "first pixel TFT", and a pixel TFT 10B corresponding to the second pixel region will be referred to as a "second pixel TFT".

The second electrode layer PL2 of the pixel electrode 17 that is connected to the first pixel TFT 10A extends in the column direction from the inside of the second pixel contact hole CHp2 corresponding to the first pixel TFT 10A toward the second pixel region side when seen in the normal direction of the substrate 1. In the example illustrated in FIG. 4, an end of the second electrode layer PL2 on the second pixel region side is covered by the second organic insulating layer 12 in the second pixel contact hole CHp2 corresponding to the second pixel TFT 10B. By using such a configuration, generation of a step due to the end of the second electrode layer PL2 on the second pixel region side (that is, an end opposite to the third portion p3) is suppressed, and light leakage due to such a step can be suppressed.

In the example illustrated in FIG. 2 and other figures, one end, in the column direction, of the third electrode layer PL3 of the pixel electrode 17 that is electrically connected to the first pixel TFT 10A at least partially overlaps at least one (here, both) of the gate line GL and the light-blocking layer 2 corresponding to the first pixel TFT 10A when seen in the normal direction of the substrate 1. Moreover, the other end, in the column direction, of the third electrode layer PL3 of the pixel electrode 17 that is electrically connected to the first pixel TFT 10A at least partially overlaps at least one (here, both) of the gate line GL and the light-blocking layer 2 corresponding to the second pixel TFT 10B when seen in the normal direction of the substrate 1. By using such a configuration, since the third electrode layer PL3 covers the opening widely in the column direction, transmittance can be improved further.

The light-blocking layer 2 is formed from a material having a light-blocking property. The light-blocking layer 2 may be formed from a conductive material having a light-blocking property. The light-blocking layer 2 having conductivity may be in an electrically floating state or may be provided with a predetermined potential. By providing the light-blocking layer 2 with a predetermined potential (fixed potential), it is possible to improve the TFT characteristics of the pixel TFT 10. The light-blocking layer 2 may be provided with a potential that is substantially the same as that of the gate electrode 6 to cause the light-blocking layer 2 to function as a lower gate electrode. That is, the pixel TFT 10 may have a double gate structure.

The active matrix substrate 100 of the present embodiment, whose transmittance can be improved as described above, is suitably used in a high-resolution (for example, 1000 ppi or higher) liquid crystal display apparatus such as a liquid crystal display apparatus for a head-mounted display.

Referring to FIGS. 5A to 10B, an example of a method of manufacturing the active matrix substrate 100 of the present embodiment will be described. FIGS. 5A to 10B are sectional step views illustrating steps of manufacturing the active matrix substrate 100.

Figure 5A:
FIG. 5A is a sectional step view illustrating a step of manufacturing the active matrix substrate 100.

First, as illustrated in FIG. 5A, the light-blocking layer 2 is formed on the substrate 1. For example, the light-blocking layer 2 can be formed by, after depositing a conductive film for a light-blocking layer by sputtering, performing patterning of the conductive film for a light-blocking layer through a photolithography process.

As the substrate 1, for example, a glass substrate, a silicon substrate, a plastic substrate (resin substrate) having heat resistance, or the like can be used. As the conductive film for a light-blocking layer, it is possible to use, as appropriate, a film including: a metal such as aluminum (Al), tungsten (W), molybdenum (Mo), tantalum (Ta), chromium (Cr), titanium (Ti), copper (Cu), or the like; an alloy of any of these; or a metal nitride of any of these. A multilayer film in which a plurality of these films are stacked may be used. Here, as the conductive film for a light-blocking layer, a film in which a tantalum nitride (TaN) film and a W film are stacked in this order is used. The thickness of the conductive film for a light-blocking layer is, for example, 100 nm or greater and 500 nm or less.

Figure 5B:
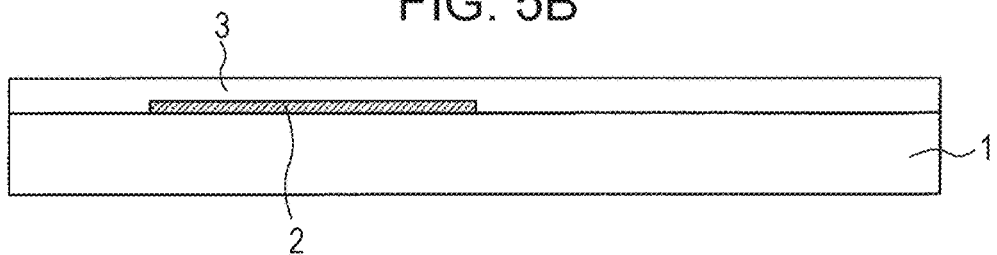
FIG. 5B is a sectional step view illustrating a step of manufacturing the active matrix substrate 100.

Next, as illustrated in FIG. 5B, the lower insulating layer 3 that covers the light-blocking layer 2 is formed. The lower insulating layer 3 can be formed by using, for example, a CVD method. As the lower insulating layer 3, it is possible to use, as appropriate, a silicon oxide ($SiO_2$) layer, a silicon nitride (SiNx) layer, a silicon oxynitride (SiOxNy; x>y) layer, a silicon nitride oxide (SiNxOy; x>y) layer, or the like. The lower insulating layer 3 may have a multilayer structure. For example, as an underlayer on the substrate 1 side, a SiNx layer for preventing diffusion of impurities and the like from the substrate 1 may be formed; and, as an overlayer thereon, a $SiO_2$ layer for ensuring insulation may be formed. The thickness of the lower insulating layer 3 is, for example, 150 nm or greater and 400 nm or less.

Figure 5C:
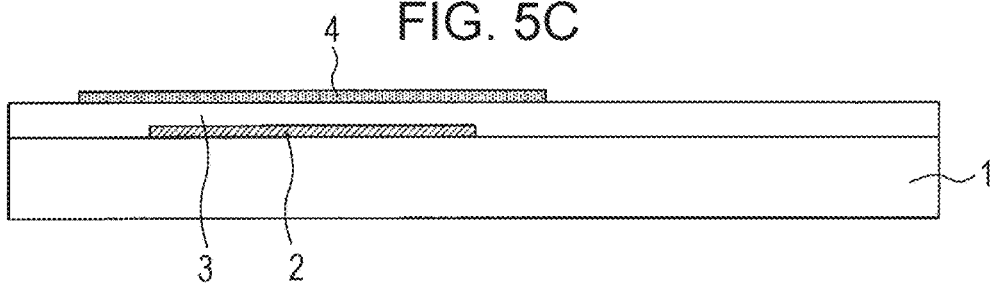
FIG. 5C is a sectional step view illustrating a step of manufacturing the active matrix substrate 100.

Then, as illustrated in FIG. 5C, the oxide semiconductor layer 4 is formed on the lower insulating layer 3. For example, the oxide semiconductor layer 4 having an insular shape can be formed by, after depositing an oxide semiconductor film by sputtering, performing patterning of the oxide semiconductor film through a photolithography process. The oxide semiconductor layer 4 is formed so as to face the light-blocking layer 2 with the lower insulating layer 3 therebetween. Here, as the oxide semiconductor layer 4, an In—Ga—Zn—O-based semiconductor layer having a composition ratio of In:Ga:Zn=1:1:1 is formed. The thickness of the oxide semiconductor layer 4 is, for example, 10 nm or greater and 200 nm or less.

Figure 5D:
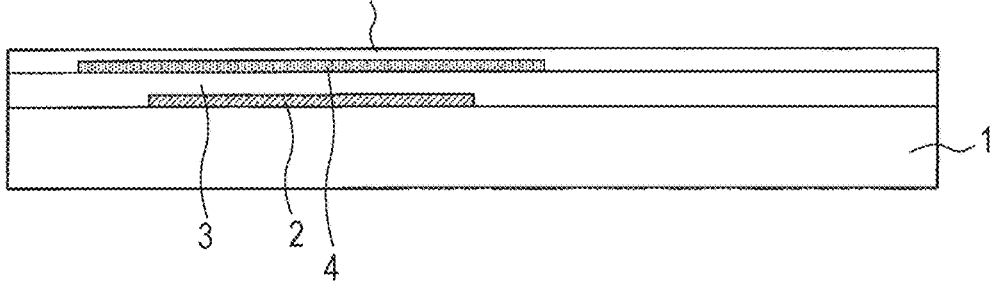
FIG. 5D is a sectional step view illustrating a step of manufacturing the active matrix substrate 100.

Next, as illustrated in FIG. 5D, the gate insulating layer 5 is deposited so as to cover the oxide semiconductor layer 4. Deposition of the gate insulating layer 5 is performed by using, for example, a CVD method. Subsequently, a process for oxidizing (for example, baking or peroxidizing) the oxide semiconductor layer 4 is performed. As the gate insulating layer 5, for example, an insulating layer similar to the lower insulating layer 3 (exemplified as the lower insulating layer 3) can be used. Here, as the gate insulating layer 5, a silicon oxide ($SiO_2$) layer is formed. When an oxide layer such as a silicon oxide layer is used as the gate insulating layer 5, since oxygen deficiency that has occurred in the channel region 4c of the oxide semiconductor layer 4 can be reduced by the oxide layer, lowering of the resistance of the channel region can be suppressed. The thickness of the gate insulating layer 5 is, for example, 50 nm or greater and 150 nm or less.

Figure 6A:
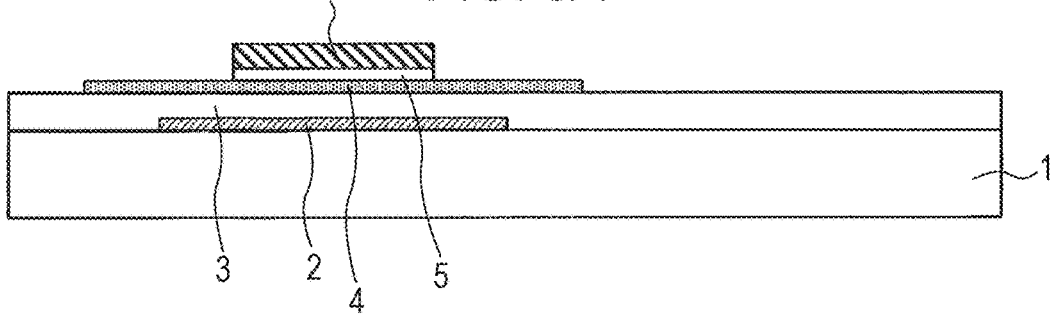
FIG. 6A is a sectional step view illustrating a step of manufacturing the active matrix substrate 100.

Then, as illustrated in FIG. 6A, the gate line GL that includes the gate electrode 6 is formed on the gate insulating layer 5. For example, the gate line GL can be formed by, after depositing a conductive film (gate metal film) by sputtering, performing patterning of the gate metal film through a photolithography process. Subsequently, patterning of the gate insulating layer 5 is performed. Note that patterning of the gate insulating layer 5 can be performed together with the gate metal film. As the gate metal film, for example, it is possible to use a film including: a metal such as aluminum (Al), tungsten (W), molybdenum (Mo), tantalum (Ta), chromium (Cr), titanium (Ti), copper (Cu), or the like; an alloy of any of these; or a metal nitride of any of these. Here, as the gate metal film, a film in which a Ti film, an Al film, and a Ti film are stacked in this order is used. The thickness of the gate metal film is, for example, 100 nm or greater and 400 nm or less.

Subsequently, a resistance-lowering process for lowering the resistance of the oxide semiconductor layer 4 may be performed by using the gate insulating layer 5 and the gate electrode 6 as a mask. As the resistance-lowering process, for example, a plasma process can be used. Due to the resistance-lowering process, a region of the oxide semiconductor layer 4 that does not overlap the gate insulating layer 5 and the gate electrode 6 (a region to become the source contact region 4s and the drain contact region 4d) becomes a low-resistance region whose specific resistance is lower than that of a region of the oxide semiconductor layer 4 that overlaps the gate insulating layer 5 and the gate electrode 6 (a region to become the channel region 4c). The low-resistance region may be a conductor region (for example, having a sheet resistance of 200Ω/☐ or lower). Note that the plasma process may be performed, without performing patterning of the gate insulating layer 5, by using the gate electrode 6 as a mask. In this case, since the photolithography process of the gate insulating layer 5 can be omitted, it is possible to shorten the manufacturing process. A method for performing the resistance-lowering process is not limited to the plasma process. For example, it is also possible to perform resistance-lowering by causing the exposed region of the oxide semiconductor layer 4 to contact a deoxidizing insulating film that can deoxidize an oxide semiconductor. Alternatively, resistance-lowering can be performed by ion implantation, such as ion doping, into the oxide semiconductor layer 4. Also in this case, since ion implantation can be performed through the gate insulating layer 5, it is possible to shorten the process.

Figure 6B:
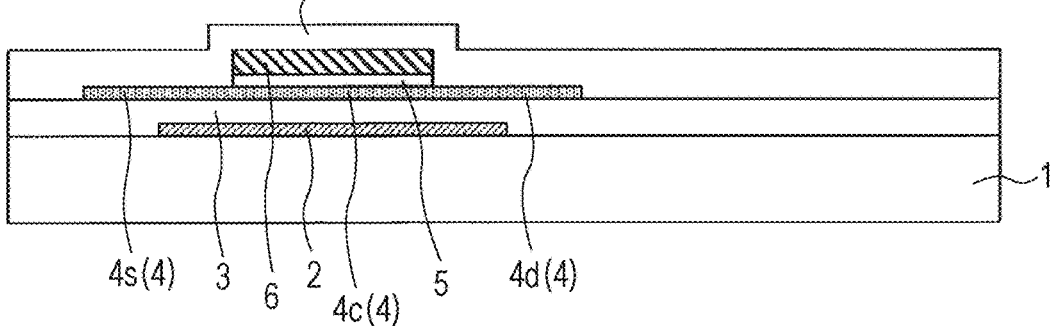
FIG. 6B is a sectional step view illustrating a step of manufacturing the active matrix substrate 100.

Next, as illustrated in FIG. 6B, the first interlayer insulating layer 8 that covers the oxide semiconductor layer 4 and the gate electrode 6 is formed. The first interlayer insulating layer 8 can be formed by using, for example, a CVD method. As the first interlayer insulating layer 8, it is possible to use: a single inorganic insulating layer such as a silicon oxide ($SiO_2$) layer, a silicon nitride (SiNx) layer, a silicon oxynitride (SiOxNy; x>y) layer, a silicon nitride oxide (SiNxOy; x>y) layer, or the like; or a stack of any of the inorganic insulating layers. The thickness of the first interlayer insulating layer 8 is, for example, 200 nm or greater and 700 nm or less. Here, a silicon oxide layer is used as the first interlayer insulating layer 8.

Figure 6C:
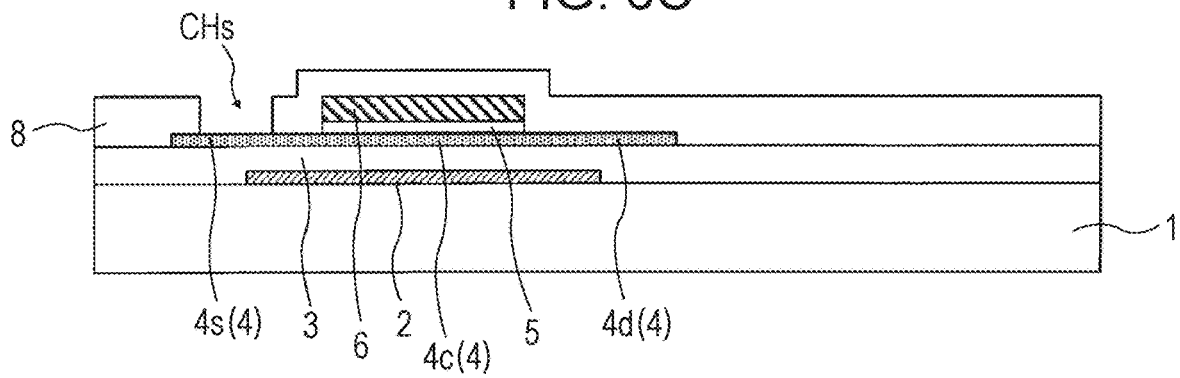
FIG. 6C is a sectional step view illustrating a step of manufacturing the active matrix substrate 100.

Then, as illustrated in FIG. 6C, the source contact hole CHs is formed in the first interlayer insulating layer 8 so that a part of the source contact region 4s of the oxide semiconductor layer 4 is exposed. The source contact hole CHs can be formed, for example, by performing patterning of the first interlayer insulating layer 8 through a photolithography process.

Figure 7A:
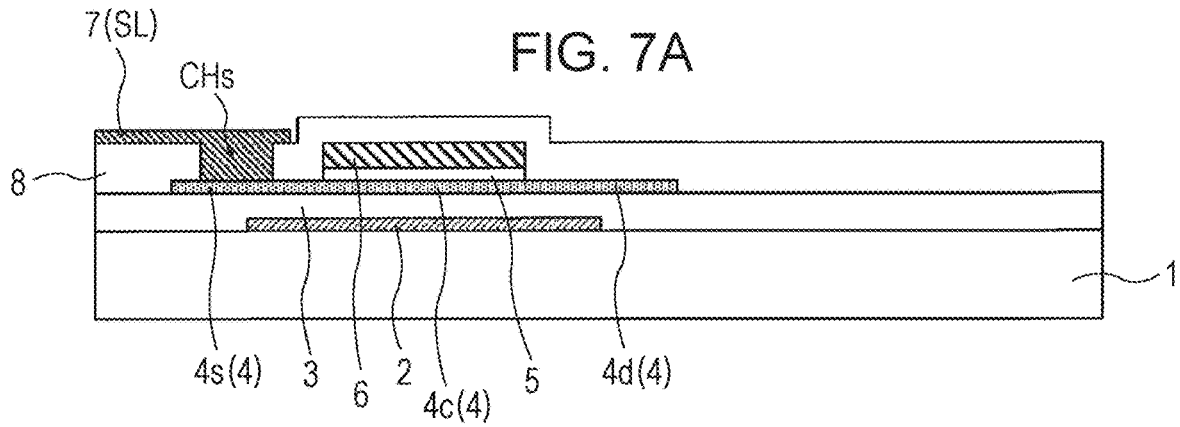
FIG. 7A is a sectional step view illustrating a step of manufacturing the active matrix substrate 100.

Next, as illustrated in FIG. 7A, the source line SL that includes the source electrode 7 is formed on the first interlayer insulating layer 8. For example, the source line SL can be formed by, after depositing a conductive film by sputtering, performing patterning of the conductive film through a photolithography process. As the conductive film for forming the source line SL, it is possible to use, as appropriate, a film including: a metal such as aluminum (Al), tungsten (W), molybdenum (Mo), tantalum (Ta), chromium (Cr), titanium (Ti), copper (Cu), or the like; an alloy of any of these; or a metal nitride of any of these. A multilayer film in which a plurality of these films are stacked may be used. Here, as the source metal film, a film in which a Ti film, an Al film, and a Ti film are stacked in this order is used. The thickness of the source metal film is, for example, 200 nm or greater and 700 nm or less.

Figure 7B:
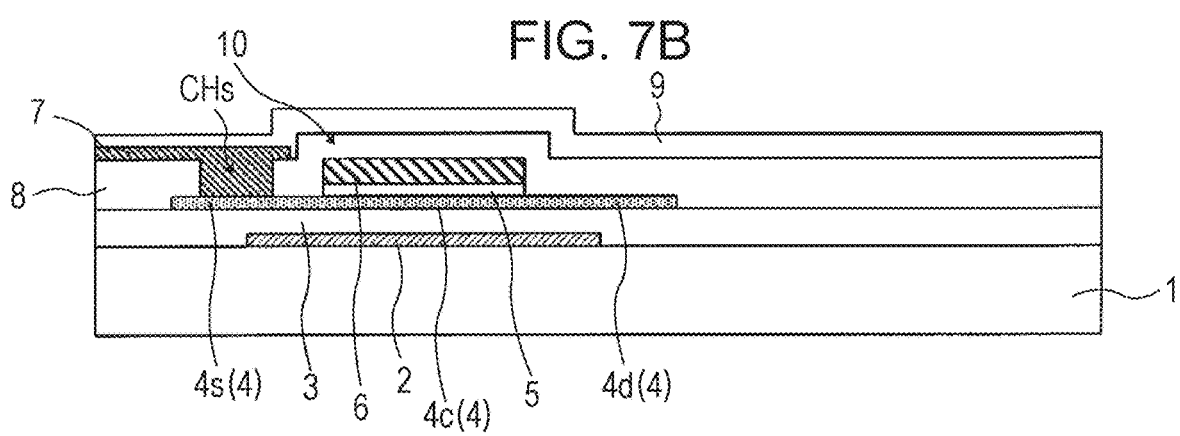
FIG. 7B is a sectional step view illustrating a step of manufacturing the active matrix substrate 100.

Then, as illustrated in FIG. 7B, the second interlayer insulating layer 9 that covers the pixel TFT 10 is formed. The second interlayer insulating layer 9 can be formed by using, for example, a CVD method. As the second interlayer insulating layer 9, it is possible to use: a single inorganic insulating layer such as a silicon oxide ($SiO_2$) layer, a silicon nitride (SiNx) layer, a silicon oxynitride (SiOxNy; x>y) layer, a silicon nitride oxide (SiNxOy; x>y) layer, or the like; or a stack of any of the inorganic insulating layers. The thickness of the second interlayer insulating layer 9 is, for example, 100 nm or greater and 600 nm or less. Here, a silicon nitride layer is used as the second interlayer insulating layer 9.

Figure 7C:
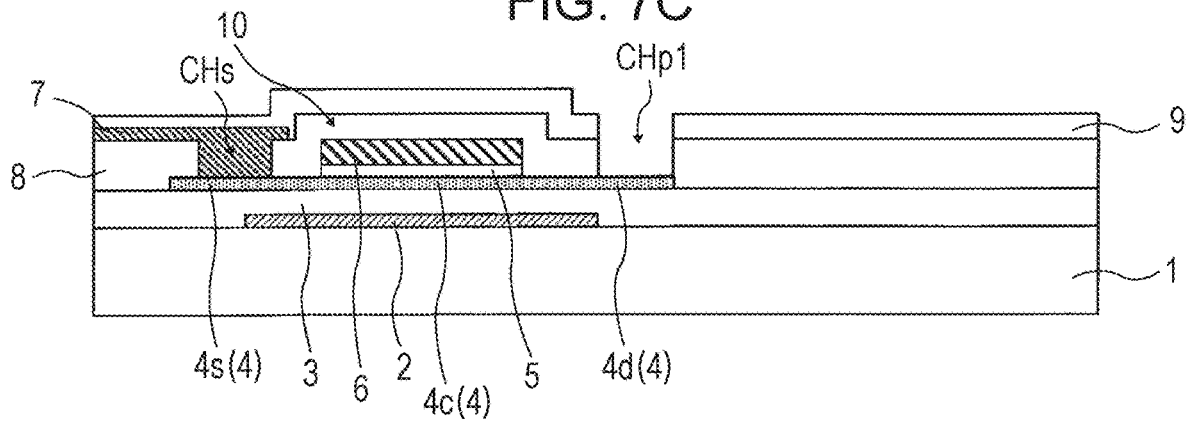
FIG. 7C is a sectional step view illustrating a step of manufacturing the active matrix substrate 100.

Next, as illustrated in FIG. 7C, the first pixel contact hole CHp1 is formed in the first interlayer insulating layer 8 and the second interlayer insulating layer 9 so that a part of the drain contact region 4d of the oxide semiconductor layer 4 is exposed. The first pixel contact hole CHp1 can be formed, for example, by performing patterning of the first interlayer insulating layer 8 and the second interlayer insulating layer 9 through a photolithography process. The first pixel contact hole CHp1 is formed, for example, to have a square shape with a side length in the range of 1.5 μm to 2.5 μm.

Figure 8A:
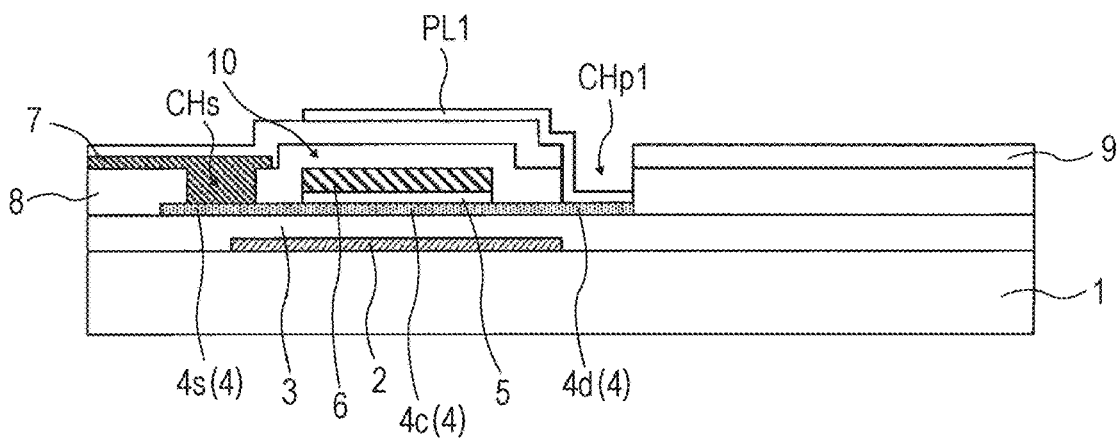
FIG. 8A is a sectional step view illustrating a step of manufacturing the active matrix substrate 100.

Then, as illustrated in FIG. 8A, the first electrode layer PL1 is formed on the second interlayer insulating layer 9 and in the first pixel contact hole CHp1. For example, the first electrode layer PL1 can be formed by, after depositing a transparent conductive film by sputtering, performing patterning of the transparent conductive film through a photolithography process. As a transparent conductive material for forming the first electrode layer PL1, for example, indium tin oxide (ITO) or indium zinc oxide (IZO) can be used. Here, indium zinc oxide is used. The thickness of the first electrode layer PL1 is, for example, 30 nm or greater and 100 nm or less.

Figure 8B:
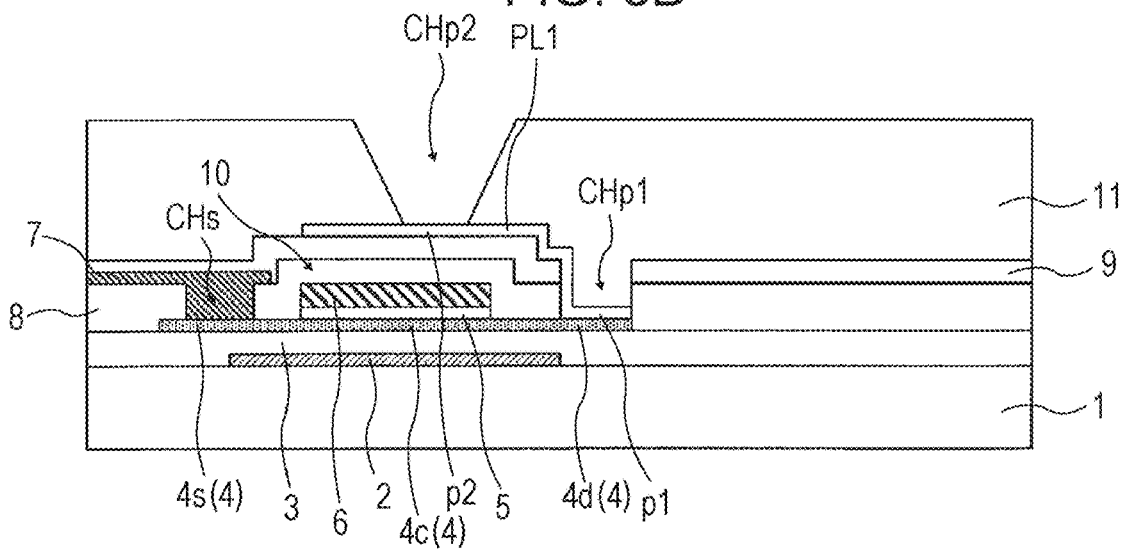
FIG. 8B is a sectional step view illustrating a step of manufacturing the active matrix substrate 100.

Next, as illustrated in FIG. 8B, the first organic insulating layer 11 that covers the second interlayer insulating layer 9 and the first electrode layer PL1 is formed. For example, by applying a photosensitive resin material and performing light exposure and development, the first organic insulating layer 11 in which the second pixel contact hole CHp2 is formed so that a part of the first electrode layer PL1 is exposed is obtained. As the photosensitive resin material, for example, a photosensitive acrylic resin can be used. The second pixel contact hole CHp2 is formed, for example, to have a square shape with a side length in the range of 2.5 μm to 3.5 μm.

Figure 9A:
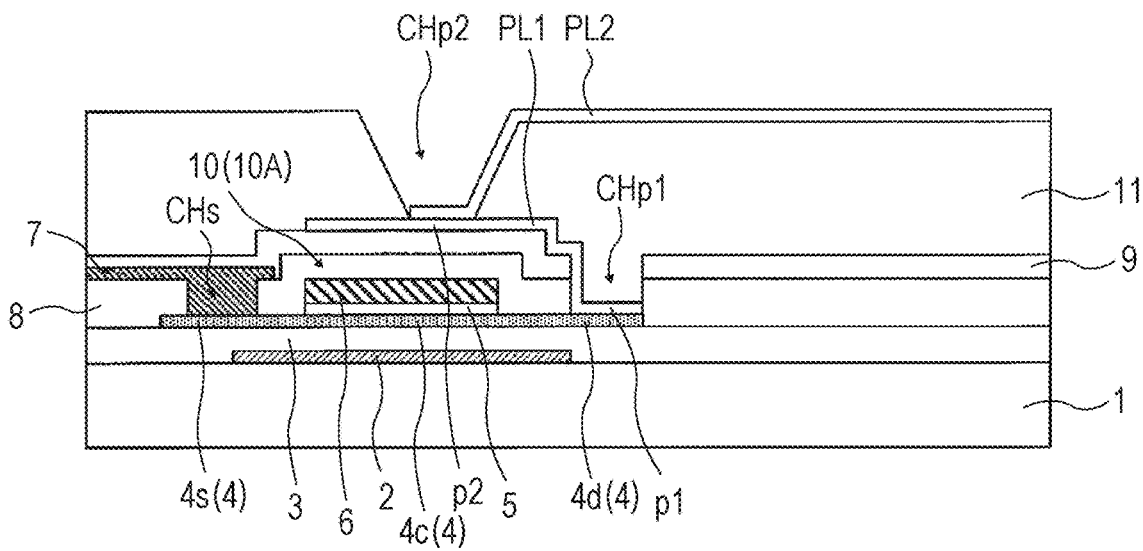
FIG. 9A is a sectional step view illustrating a step of manufacturing the active matrix substrate 100.

Then, as illustrated in FIG. 9A, the second electrode layer PL2 is formed on the first organic insulating layer 11 and in the second pixel contact hole CHp2. For example, the second electrode layer PL2 can be formed by, after depositing a transparent conductive film by sputtering, performing patterning of the transparent conductive film through a photolithography process. As a transparent conductive material for forming the second electrode layer PL2, for example, indium tin oxide or indium zinc oxide can be used. Here, indium zinc oxide is used. The thickness of the second electrode layer PL2 is, for example, 30 nm or greater and 100 nm or less.

Figure 9B:
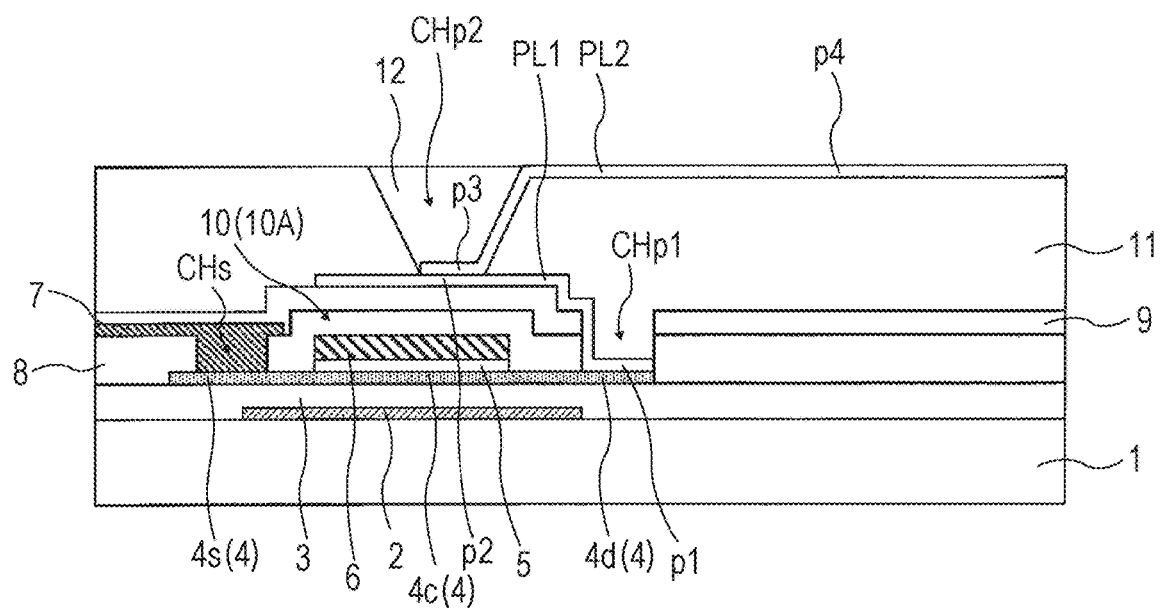
FIG. 9B is a sectional step view illustrating a step of manufacturing the active matrix substrate 100.

Next, as illustrated in FIG. 9B, the second organic insulating layer 12 that fills the second pixel contact hole CHp2 is formed. For example, by applying a photosensitive resin material and performing light exposure and development, the second organic insulating layer 12 is obtained. As the photosensitive resin material, for example, a photosensitive acrylic resin can be used. During light exposure, by using a multi-tone mask as a mask, it is possible to fill the inside of the second pixel contact hole CHp2 with the second organic insulating layer 12 with high precision. As the multi-tone mask, to be specific, a gray-tone mask or a half-tone mask can be used. Slits smaller than the resolution of an exposure machine are formed in a gray-tone mask, and semi-exposure is realized by blocking a part of light with the slits. On the other hand, with a half-tone mask, semi-exposure is realized by using a semitransparent film.

Figure 10A:
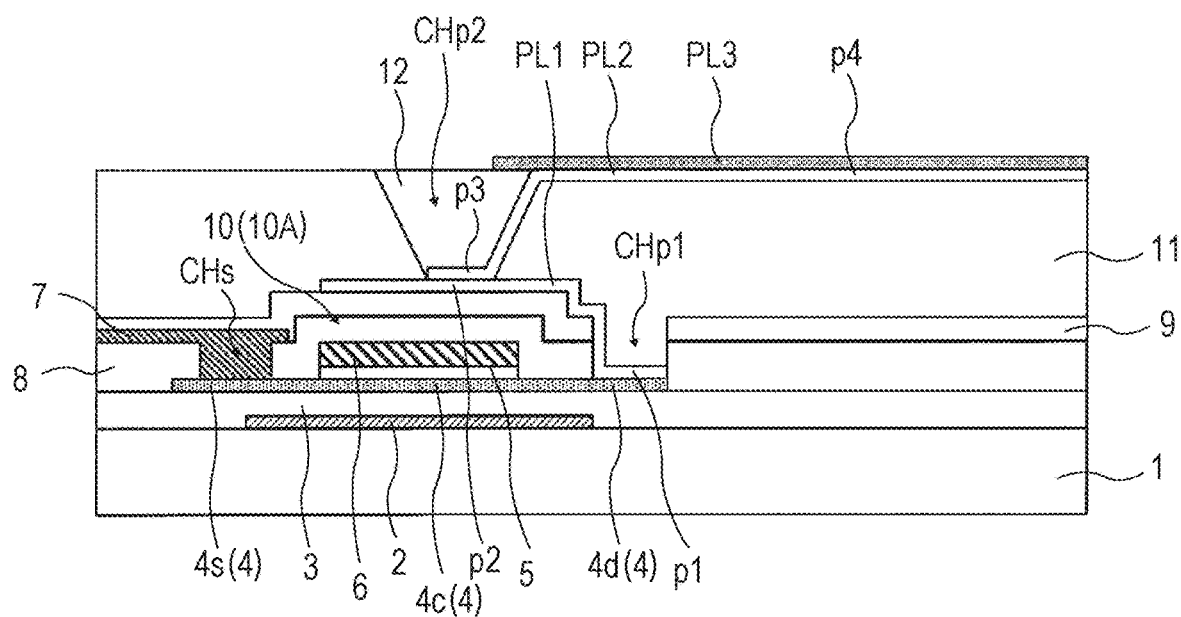
FIG. 10A is a sectional step view illustrating a step of manufacturing the active matrix substrate 100.

Then, as illustrated in FIG. 10A, the third electrode layer PL3 is formed on the first organic insulating layer 11, on the second electrode layer PL2, and on the second organic insulating layer 12. For example, the third electrode layer PL3 can be formed by, after depositing a transparent conductive film by sputtering, performing patterning of the transparent conductive film through a photolithography process. As a transparent conductive material for forming the third electrode layer PL3, for example, indium tin oxide or indium zinc oxide can be used. Here, indium zinc oxide is used. The thickness of the third electrode layer PL3 is, for example, 30 nm or greater and 100 nm or less.

Figure 10B:
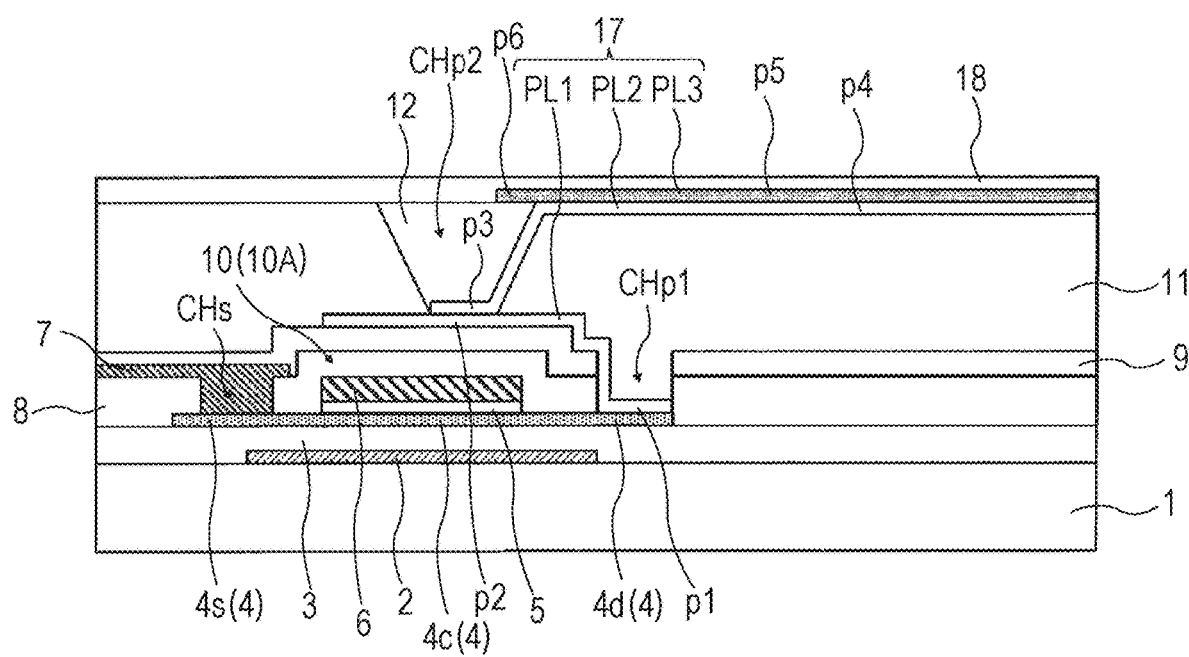
FIG. 10B is a sectional step view illustrating a step of manufacturing the active matrix substrate 100.

Next, as illustrated in FIG. 10B, the dielectric layer 18 that covers the third electrode layer PL3 is formed. For example, the dielectric layer 18 can be formed by using, for example, a CVD method. As the dielectric layer 18, for example, an inorganic insulating layer similar to the first interlayer insulating layer 8 and the second interlayer insulating layer 9 can be used. Here, a silicon nitride layer is used as the dielectric layer 18. The thickness of the dielectric layer 18 is, for example, 50 nm or greater and 300 nm or less.

Subsequently, by forming the common electrode 19 on the dielectric layer 18, the active matrix substrate 100 illustrated FIG. 3 and other figures is obtained. For example, the common electrode 19 can be formed by, after depositing a transparent conductive film by sputtering, performing patterning of the transparent conductive film through a photolithography process. As a transparent conductive material for forming the common electrode 19, for example, indium tin oxide or indium zinc oxide can be used. Here, indium zinc oxide is used. The thickness of the common electrode is, for example, 30 nm or greater and 100 nm or less. In this way, the active matrix substrate 100 is obtained.

Second Embodiment

Figure 11:
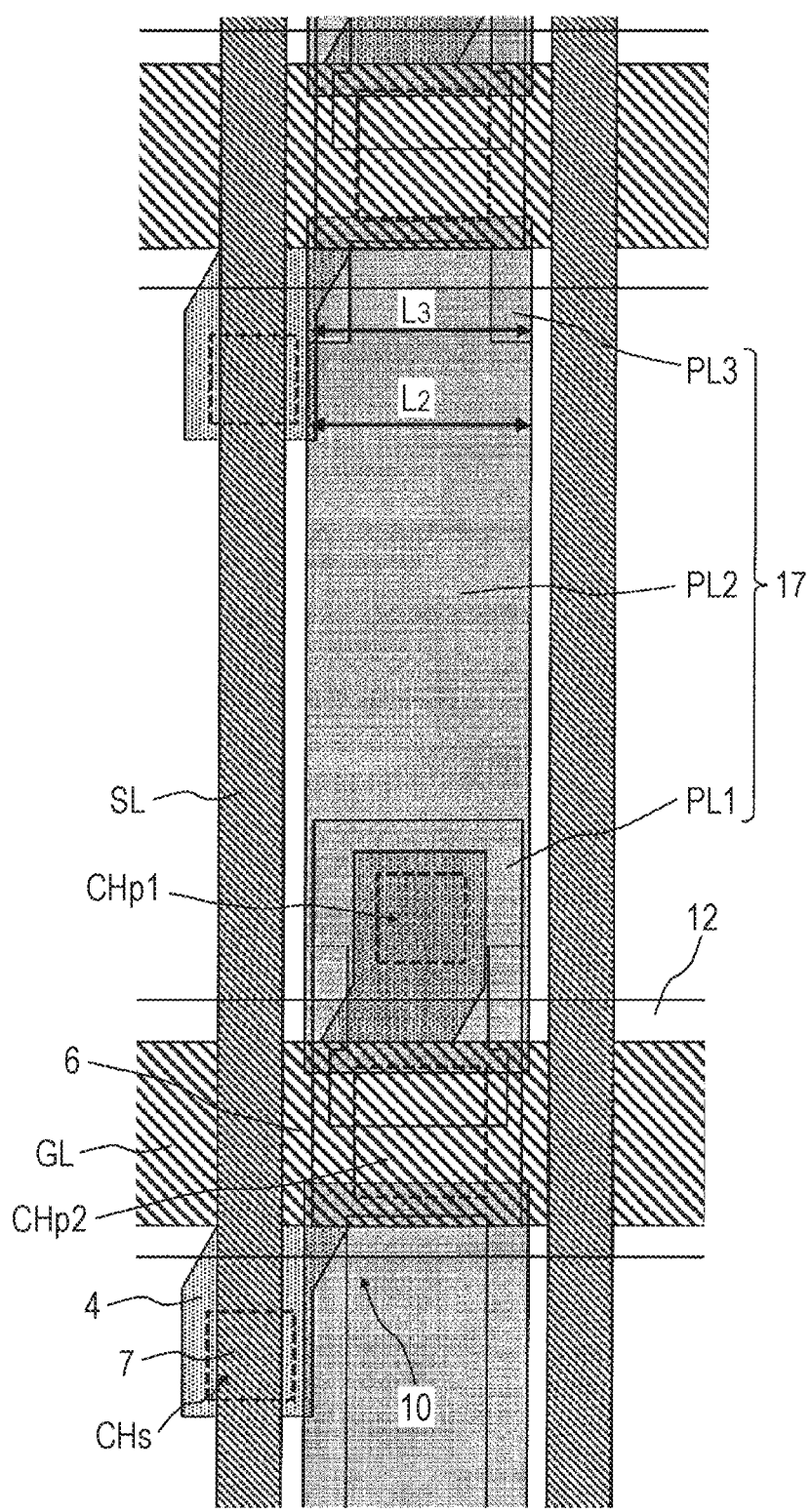
FIG. 11 is a plan view schematically illustrating another active matrix substrate 200 according to an embodiment of the present invention.

Referring to FIG. 11, an active matrix substrate 200 in the present embodiment will be described. FIG. 11 is a plan view schematically illustrating the active matrix substrate 200. Hereafter, mainly the differences between the active matrix substrate 200 and the active matrix substrate 100 of the first embodiment will be described.

As illustrated in FIG. 11, in the active matrix substrate 200, the length $L_2$ of the second electrode layer PL2 of the pixel electrode 17 in the row direction is substantially the same as the length $L_3$ of the third electrode layer PL3 in the row direction. When seen in the normal direction of the substrate 1, the positions of both ends of the second electrode layer PL2 in the row direction are substantially the same as the positions of both ends of the third electrode layer PL3 in the row direction. The second electrode layer PL2 and the third electrode layer PL3 are formed from, for example, the same transparent conductive material.

As described above, in the active matrix substrate 200 of the present embodiment, the positions of both ends of the second electrode layer PL2 in the row direction are substantially the same as the positions of both ends of the third electrode layer PL3 in the row direction. Therefore, generation of an excess step in an opening of the pixel region P is suppressed, and light leakage is suppressed.

The active matrix substrate 200 can be manufactured, for example, as follows.

First, in the same way as described above with reference to FIGS. 5A to 7C, the pixel TFT 10 and the second interlayer insulating layer 9 are sequentially formed on the substrate 1.

Next, in the same way as described above with reference to FIG. 8A, the first electrode layer PL1 is formed. To be specific, the first electrode layer PL1 is formed by, after depositing a transparent conductive film (hereafter, referred to as a "first transparent conductive film"), performing patterning of the first transparent conductive film.

Then, in the same way as described above with reference to FIG. 8B, the first organic insulating layer 11 that covers the pixel TFT 10 and the first electrode layer PL1 and that has the second pixel contact hole CHp2 is formed.

Figure 12A:
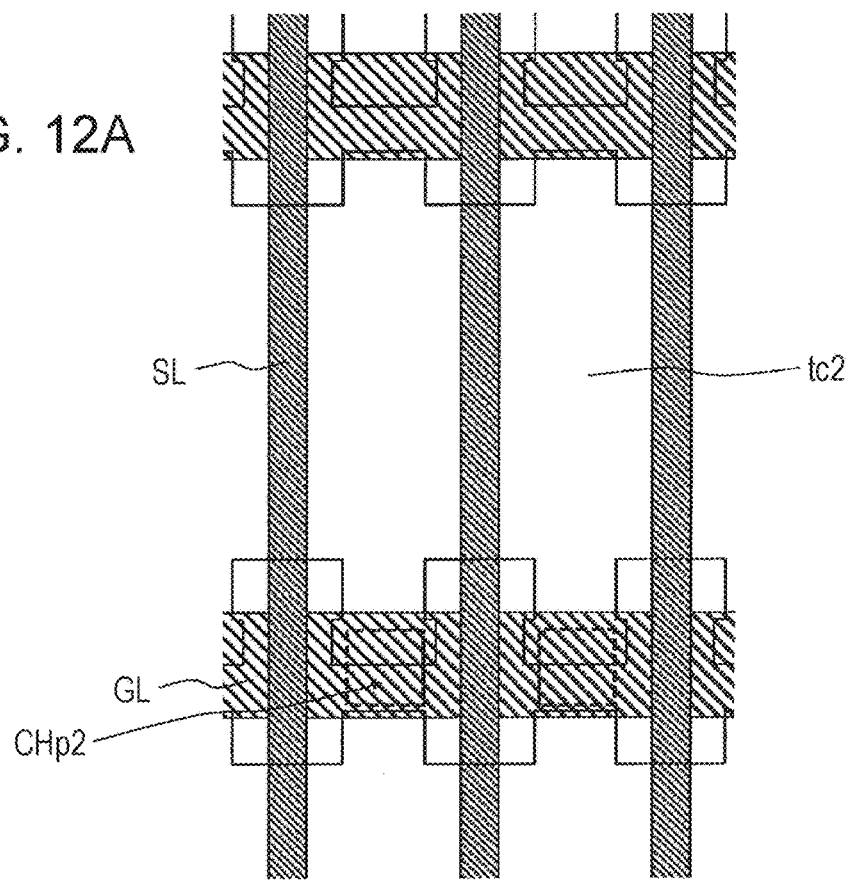
FIG. 12A is plan view illustrating a step of manufacturing the active matrix substrate 200.

Next, as illustrated in FIG. 12A, after depositing a transparent conductive film (hereafter, referred to as a "second transparent conductive film") tc2 on the first organic insulating layer 11 and in the second pixel contact hole CHp2, patterning of the second transparent conductive film tc2 is performed. As the material of the second transparent conductive film tc2, a material that is soluble (that is, having a sufficiently high etching rate) in an etchant that is used when performing patterning of a transparent conductive film for forming the third electrode layer PL3 is selected. The second transparent conductive film tc2 on which patterning has been performed is separated between adjacent pixel regions P in the column direction, but is not separated between adjacent pixel regions P in the row direction. Note that, in FIG. 12A (and in FIGS. 12B to 12E described below), some constituent elements are omitted for ease of understanding the description.

Figure 12B:
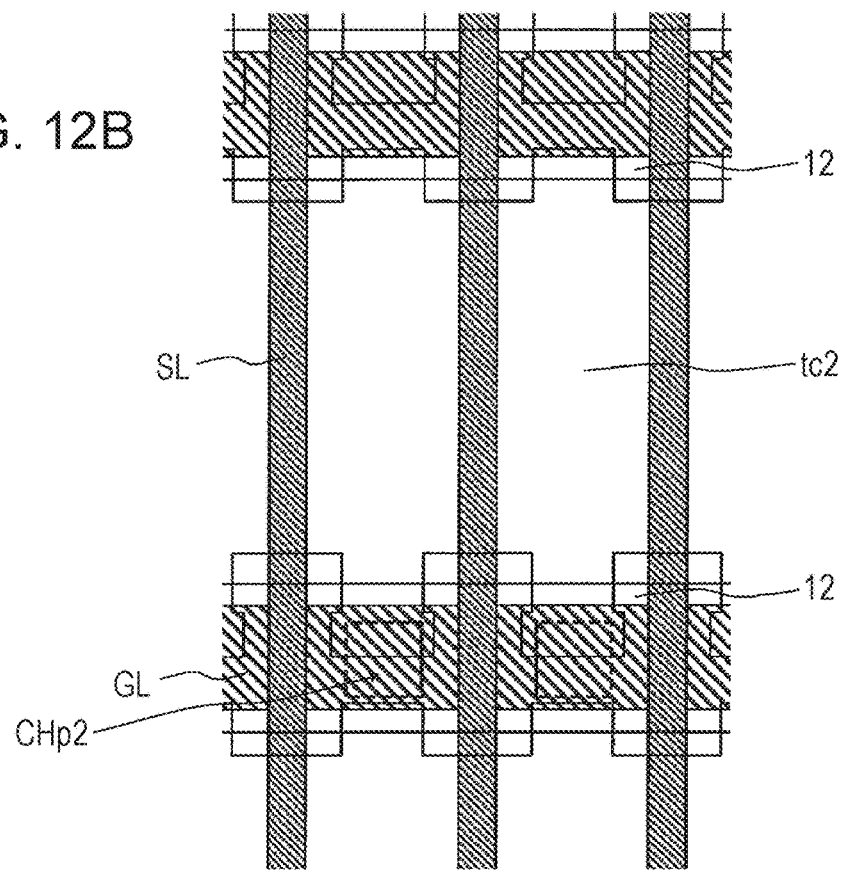
FIG. 12B is plan view illustrating a step of manufacturing the active matrix substrate 200.

Then, as illustrated in FIG. 12B, the second organic insulating layer 12 is formed so as to fill the second pixel contact hole CHp2. As already described above, this step can be suitably performed by using a multi-tone mask.

Next, after depositing a transparent conductive film (hereafter, referred to as a "third transparent conductive film") on the second transparent conductive film tc2, on the first organic insulating layer 11, and on the second organic insulating layer 12, by performing patterning of the third transparent conductive film and additional (second) patterning of the second transparent conductive film tc2 simultaneously, the third electrode layer PL3 and the second electrode layer PL2 are formed.

Figure 12C:
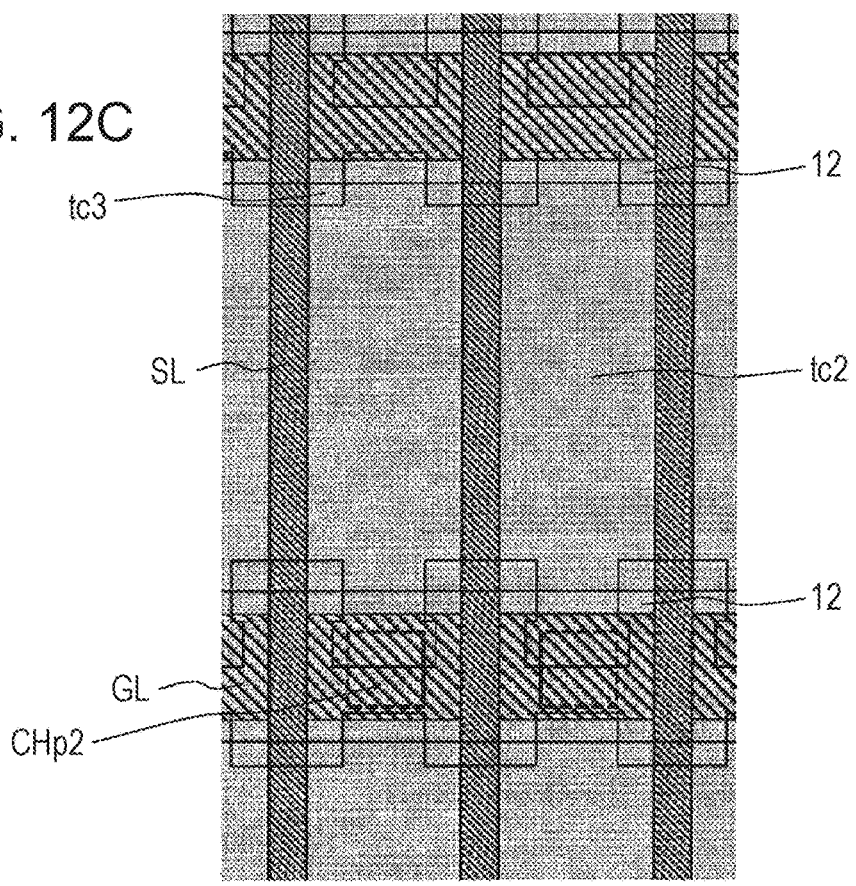
FIG. 12C is plan view illustrating a step of manufacturing the active matrix substrate 200.
Figure 12D:
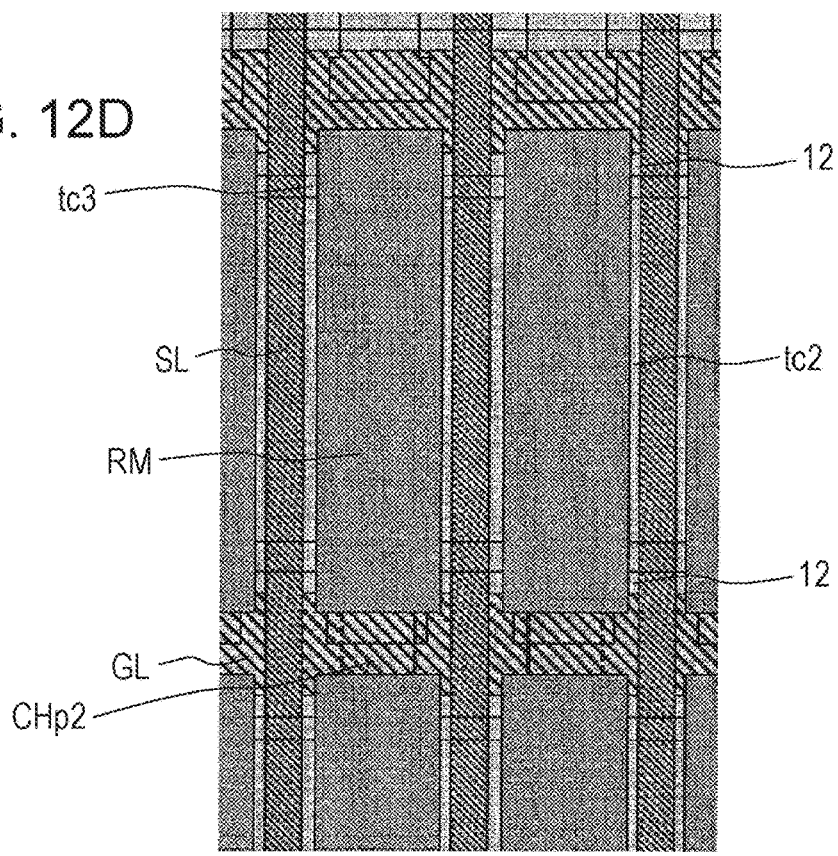
FIG. 12D is plan view illustrating a step of manufacturing the active matrix substrate 200.
Figure 12E:
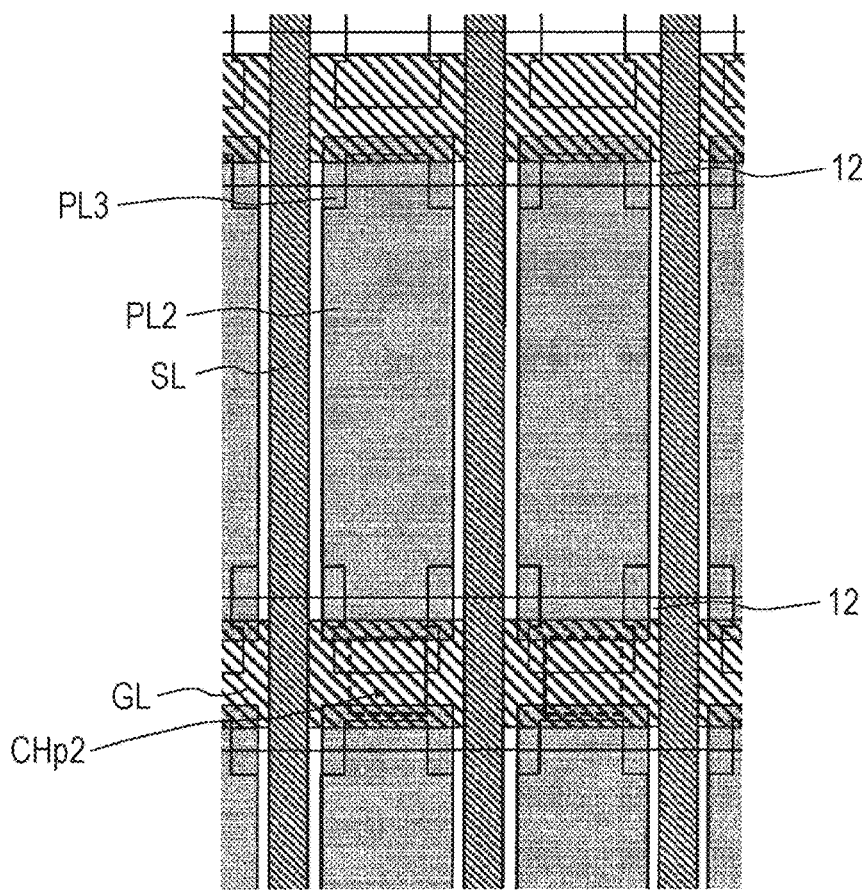
FIG. 12E is plan view illustrating a step of manufacturing the active matrix substrate 200.

To be specific, first, as illustrated in FIG. 12C, a third transparent conductive film tc3 is deposited on the second transparent conductive film tc2, on the first organic insulating layer 11, and on the second organic insulating layer 12. Next, as illustrated in FIG. 12D, a resist mask RM having a predetermined mask pattern is formed on the third transparent conductive film tc3. Subsequently, portions of the third transparent conductive film tc3 and the second transparent conductive film tc2 that are not covered by the resist mask RM are removed by performing etching, and thereby the third electrode layer PL3 and the second electrode layer PL2 illustrated in FIG. 12E are formed. At this time, a portion of the second transparent conductive film tc2 that is continuous in the row direction between the pixel regions P is removed, and thereby the second electrode layer PL2 that is separated in the row direction is obtained.

Subsequently, by forming the dielectric layer 18 that covers the third electrode layer PL3 and then forming the common electrode 19 on the dielectric layer 18, the active matrix substrate 200 is obtained. With the manufacturing method described above, increase of parasitic capacitance due to forming of the second electrode layer PL2 so as to protrude from the third electrode layer PL3 is suppressed.

Third Embodiment

Figure 13A:
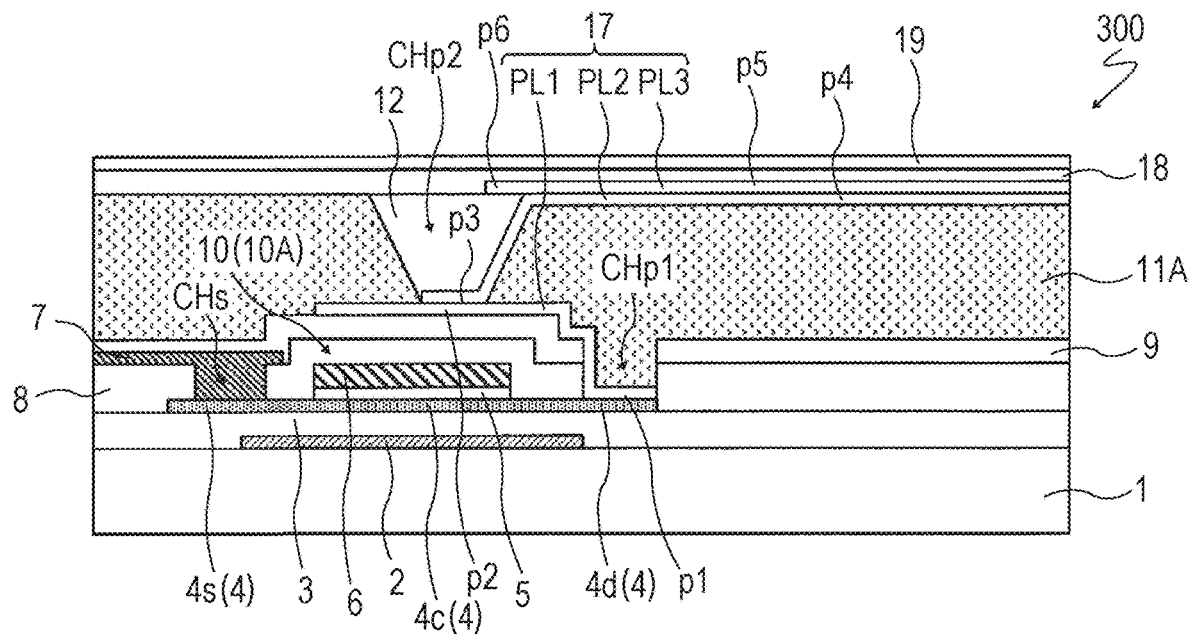
FIG. 13A is a sectional view schematically illustrating still another active matrix substrate 300 according to an embodiment of the present invention.
Figure 13B:
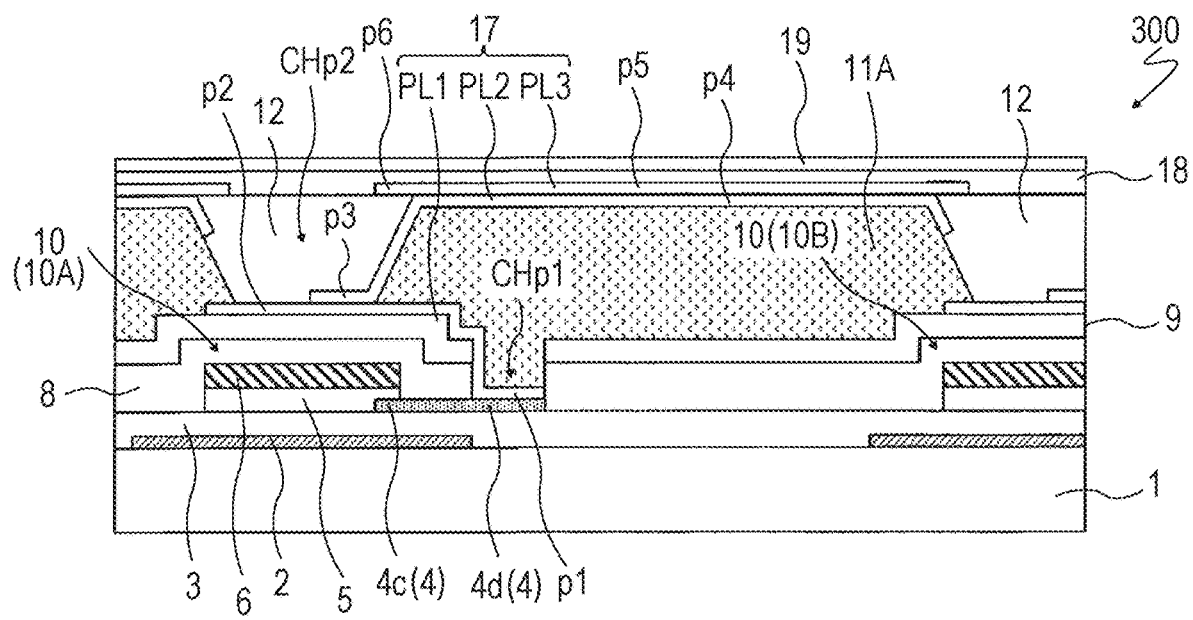
FIG. 13B is a sectional view schematically illustrating the active matrix substrate 300.

Referring to FIGS. 13A and 13B, an active matrix substrate 300 in the present embodiment will be described. FIGS. 13A and 13B are sectional views schematically illustrating the active matrix substrate 300, and correspond to the sections of the active matrix substrate 100 of the first embodiment illustrated in FIGS. 3 and 4. Hereafter, mainly the differences between the active matrix substrate 300 and the active matrix substrate 100 of the first embodiment will be described.

A first organic insulating layer 11A included in the active matrix substrate 300 of the present embodiment is a color filter layer. The color filter layer includes, for example, a red color filter, a green color filter, and a blue color filter. The first organic insulating layer 11A that is the color filter layer is formed from, for example, a photosensitive resin material in which a pigment is dispersed (color resist). On the first organic insulating layer 11A, an additional organic insulating layer (third organic insulating layer) may be formed as a flattening layer, as necessary.

It is possible to realize a color filter on array (COA) structure by using the active matrix substrate 300, which includes the color filter layer (the first organic insulating layer 11A), as an active matrix substrate of a liquid crystal display apparatus. Although a structure in which a color filter layer is provided on the counter substrate side (referred to as a "counter CF structure") is generally used as a structure for realizing a color display, with the counter CF structure, color mixture may occur due to misaligned bonding of two substrates, and occurrence of color mixture becomes more pronounced in a high-definition liquid crystal display apparatus. In contrast, with the COA structure, color mixture due to misaligned bonding can be prevented.

Regarding Oxide Semiconductor

The oxide semiconductor included in the oxide semiconductor layer 4 may be an amorphous oxide semiconductor, or may be a crystalline oxide semiconductor including a crystalline portion. Examples of the crystalline oxide semiconductor include a polycrystalline oxide semiconductor, a microcrystalline oxide semiconductor, and a crystalline oxide semiconductor whose c-axis is oriented approximately perpendicular to a layer surface.

The oxide semiconductor layer 4 may have a multilayer structure with two or more layers. The oxide semiconductor layer 4 having a multilayer structure may include an amorphous oxide semiconductor layer and a crystalline oxide semiconductor layer, or may include a plurality of crystalline oxide semiconductor layers having different crystal structures. The oxide semiconductor layer 4 having a multilayer structure may include a plurality of amorphous oxide semiconductor layers. When the oxide semiconductor layer 4 has a multilayer structure, the energy gaps of the layers can differ from each other.

The material, the structure, the deposition method of an amorphous oxide semiconductor and each crystalline oxide semiconductor described above, the configuration of an oxide semiconductor layer having a multilayer structure, and the like are described, for example, in Japanese Unexamined Patent Application Publication No. 2014-007399. For reference, the entire contents disclosed in Japanese Unexamined Patent Application Publication No. 2014-007399 are incorporated in the present description.

The oxide semiconductor layer 4 may include, for example, at least one metallic element among In, Ga, and Zn. In the embodiment described above, the oxide semiconductor layer 4 includes, for example, an In—Ga—Zn—O-based semiconductor (for example, indium-gallium-zinc oxide). Here, the In—Ga—Zn—O-based semiconductor is a ternary oxide of In (indium), Ga (gallium), and Zn (zinc), and the proportion (composition ratio) of In, Ga, and Zn is not particularly limited and includes, for example, In:Ga:Zn=2:2:1, In:Ga:Zn=1:1:1, In:Ga:Zn=1:1:2, or the like. Such an oxide semiconductor layer 4 can be formed from an oxide semiconductor film including In—Ga—Zn—O-based semiconductor.

The In—Ga—Zn—O-based semiconductor may be amorphous, or may be crystalline. As the crystalline In—Ga—Zn—O-based semiconductor, a crystalline In—Ga—Zn—O-based semiconductor whose c-axis is oriented approximately perpendicular to a layer surface is preferable.

The crystal structure of a crystalline In—Ga—Zn—O-based semiconductor is disclosed in, for example, Japanese Unexamined Patent Application Publication No. 2014-007399 described above, Japanese Unexamined Patent Application Publication No. 2012-134475, Japanese Unexamined Patent Application Publication No. 2014-209727, and the like. For reference, the entire contents disclosed in Japanese Unexamined Patent Application Publication No. 2012-134475 and Japanese Unexamined Patent Application Publication No. 2014-209727 are incorporated in the present description. Since a TFT including an In—Ga—Zn—O-based semiconductor layer has high mobility (higher than 20 times that of an a-Si TFT) and a low leakage current (less than 1/100 times that of an a-Si TFT), the TFT is suitably used as a drive TFT (for example, a TFT that is included, around a display region including a plurality of pixels, in a drive circuit that is provided on the same substrate as the display region) and a pixel TFT (a TFT provided in a pixel).

The oxide semiconductor layer 4 may include another oxide semiconductor, instead of an In—Ga—Zn—O-based semiconductor. For example, the oxide semiconductor layer 4 may include, for example, an In—Sn—Zn—O-based semiconductor (for example, $In_2O_3$—$SnO_2$—ZnO; InSnZnO). The In—Sn—Zn—O-based semiconductor is a ternary oxide of In (indium), Sn (tin), and Zn (zinc). Alternatively, the oxide semiconductor layer may include an In—Al—Zn—O-based semiconductor, an In—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, an In—Ga—Zn—Sn—O-based semiconductor, or the like.

Liquid Crystal Display Apparatus

Figure 14:
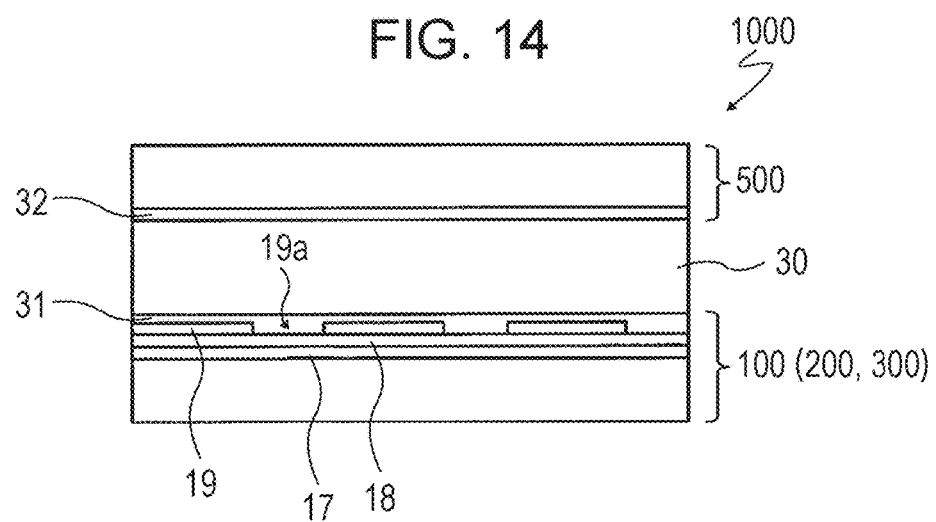
FIG. 14 is a sectional view schematically illustrating a liquid crystal display apparatus 1000 including the active matrix substrate 100 (200, 300) according to an embodiment of the present invention.

The active matrix substrates 100, 200, and 300 according to embodiments of the present invention can be suitably used in a liquid crystal display apparatus. FIG. 14 illustrates an example of a liquid crystal display apparatus.

A liquid crystal display apparatus 1000 illustrated in FIG. 14 includes the active matrix substrate 100 (or the active matrix substrate 200 or 300), a counter substrate 500 that is provided so as face the active matrix substrate 100, and a liquid crystal layer 30 that is provided between the active matrix substrate 100 and the counter substrate 500.

The active matrix substrate 100 includes the pixel TFT 10 (not shown here) disposed in each pixel region P, the pixel electrode 17 electrically connected to the pixel TFT 10, the dielectric layer 18 provided so as to cover the pixel electrode 17, and the common electrode 19 disposed on the dielectric layer 18 and facing the pixel electrode 17. In the common electrode 19, at least one slit 19a is formed for each pixel region P.

Alignment films 31 and 32 are respectively provided on the outermost surfaces of the active matrix substrate 100 and the counter substrate 500 on the liquid crystal layer 30 side. The counter substrate 500 has a color filter layer (not shown). When the active matrix substrate 300 is used instead of the active matrix substrate 100, the counter substrate 500 does not have a color filter layer. The thickness (cell gap) of the liquid crystal layer 30 is defined by a columnar spacer (not shown) provided on the liquid crystal layer 30 side of the counter substrate 500.

The liquid crystal display apparatus 1000 is suitably used for a high-definition (for example, 1000 ppi or higher) liquid crystal display apparatus, and is suitably used, for example, in a liquid crystal display apparatus for a head-mounted display. Not only high definition but also rapid response is required for a liquid crystal display apparatus for a head-mounted display. In order to obtain rapid response, a positive liquid crystal material is more advantageous than a negative liquid crystal material. When a positive liquid crystal material is used, the initial orientational axis of liquid crystal molecules is set in a direction substantially parallel to the direction in which the slit 19a extends. For example, when the slit 19a extends in the column direction, the initial orientational axis of liquid crystal molecules is set to be substantially parallel to the column direction.

Light leakage due to a step extending in a direction along the initial orientational axis is slight and does not cause a problem, but light leakage due to a step extending in a direction perpendicular to the initial orientational axis may cause a problem. With the liquid crystal display apparatus 1000 including the active matrix substrate 100 (or the active matrix substrate 200 or 300), since the latter step is flattened by the second organic insulating layer 12, occurrence of light leakage can be suppressed.

Here, the liquid crystal display apparatus 1000 of an FFS mode, which is a type of horizontal-electric-field mode, has been described as an example, but an active matrix substrate according to an embodiment of the present invention may be used in a liquid crystal display apparatus of another display mode. In a liquid crystal display apparatus of a vertical-electric-field mode, such as a TN (Twisted Nematic) mode or a VA (Vertical Alignment) mode, the common electrode is provided on the counter substrate side.

INDUSTRIAL APPLICABILITY

With an embodiment of the present invention, it is possible to provide an active matrix substrate with which decrease of transmittance due to a contact hole formed in an organic insulating layer is suppressed. The active matrix substrate according to an embodiment of the present invention is suitably used in a high-resolution (for example, 1000 ppi or higher) liquid crystal display apparatus such as a liquid crystal display apparatus for a head-mounted display.

REFERENCE SIGNS LIST 1 substrate
2 light-blocking layer
3 lower insulating layer
4 oxide semiconductor layer
4c channel region
4s source contact region
4d drain contact region
5 gate insulating layer
6 gate electrode
7 source electrode
8 first interlayer insulating layer
9 second interlayer insulating layer
10 pixel TFT
11 first organic insulating layer
12 second organic insulating layer
17 pixel electrode
18 dielectric layer
19 common electrode
30 liquid crystal layer
31, 32 alignment film
100, 200, 300 active matrix substrate
500 counter substrate
1000 liquid crystal display apparatus
DR display region
FR non-display region
P pixel region
GL gate line
SL source line
GD gate driver
SD source driver
CHp1 first pixel contact hole
CHp2 second pixel contact hole
CHs source contact hole
PL1 first electrode layer
PL2 second electrode layer
PL3 third electrode layer

The invention claimed is:

1. An active matrix substrate having a plurality of pixel regions that are arranged in a matrix pattern including a plurality of rows and a plurality of columns, comprising:
a substrate;
a pixel TFT that is supported by the substrate and provided in correspondence with each of the plurality of pixel regions, the pixel TFT including an oxide semiconductor layer including a channel region and a source contact region and a drain contact region that are located on both sides of the channel region, a gate insulating layer that is provided on the channel region of the oxide semiconductor layer, a gate electrode that is provided on the gate insulating layer and faces the channel region with the gate insulating layer therebetween, and a source electrode that is electrically connected to the source contact region;
a gate line that extends in a row direction and supplies a gate signal to the pixel TFT;
a source line that extends in a column direction and supplies a source signal to the pixel TFT;
a light-blocking layer that is located between the substrate and the oxide semiconductor layer and faces at least the channel region of the oxide semiconductor layer;
a first interlayer insulating layer that is provided so as to cover the oxide semiconductor layer and the gate electrode;
a first organic insulating layer that is located on the first interlayer insulating layer and provided so as to cover the pixel TFT; and
a pixel electrode that includes a portion located on the first organic insulating layer and is electrically connected to the pixel TFT,
wherein, at least in the first interlayer insulating layer, a first pixel contact hole is formed so that at least a part of the drain contact region is exposed,
wherein, in the first organic insulating layer, a second pixel contact hole is formed so as to at least partially overlap at least one of the gate line and the light-blocking layer when seen in a normal direction of the substrate,
wherein the pixel electrode includes a first electrode layer, a second electrode layer, and a third electrode layer each of which is formed from a transparent conductive material,
wherein the first electrode layer, the second electrode layer, and the third electrode layer are arranged in this order from the substrate side and electrically connected to each other,
wherein the first electrode layer includes a first portion that is in contact with the drain contact region of the oxide semiconductor layer in the first pixel contact hole and a second portion that is located in the second pixel contact hole,
wherein the second electrode layer includes a third portion that is in contact with the second portion of the first electrode layer in the second pixel contact hole and a fourth portion that is located on the first organic insulating layer,
wherein the active matrix substrate
further includes a second organic insulating layer that is formed so as to fill the second pixel contact hole and covers the third portion of the second electrode layer,
wherein the third electrode layer includes a fifth portion that is in contact with the fourth portion of the second electrode layer and a sixth portion that is located on the second organic insulating layer, and
wherein a length of the second electrode layer in the row direction is less than or equal to a length of the third electrode layer in the row direction.

2. The active matrix substrate according to claim 1, wherein the length of the second electrode layer in the row direction is less than the length of the third electrode layer in the row direction, and
wherein, when seen in the normal direction of the substrate, both ends of the second electrode layer in the row direction are located further inward than both ends of the third electrode layer in the row direction.

3. The active matrix substrate according to claim 1, wherein the length of the second electrode layer in the row direction is substantially the same as the length of the third electrode layer in the row direction, and wherein, when seen in the normal direction of the substrate, positions of both ends of the second electrode layer in the row direction are substantially the same as positions of both ends of the third electrode layer in the row direction.

4. The active matrix substrate according to claim 3, wherein the second electrode layer and the third electrode layer are formed from the same transparent conductive material.

5. The active matrix substrate according to claim 1, wherein the first organic insulating layer is a color filter layer.

6. The active matrix substrate according to claim 1, wherein, when any two pixel regions, among the plurality of pixel regions, that are adjacent to each other in the column direction are referred to as a first pixel region and a second pixel region,
the pixel TFT corresponding to the first pixel region is referred to as a first pixel TFT, and the pixel TFT corresponding to the second pixel region is referred to as a second pixel TFT,
the second electrode layer of the pixel electrode that is electrically connected to the first pixel TFT extends in the column direction from an inside of the second pixel contact hole corresponding to the first pixel TFT toward the second pixel region side when seen in the normal direction of the substrate, and
an end of the second electrode layer on the second pixel region side is covered by the second organic insulating layer in the second pixel contact hole corresponding to the second pixel TFT.

7. The active matrix substrate according to claim 1, wherein, when any two pixel regions, among the plurality of pixel regions, that are adjacent to each other in the column direction are referred to as a first pixel region and a second pixel region,
the pixel TFT corresponding to the first pixel region is referred to as a first pixel TFT, and the pixel TFT corresponding to the second pixel region is referred to as a second pixel TFT,
one end, in the column direction, of the third electrode layer of the pixel electrode that is electrically connected to the first pixel TFT at least partially overlaps at least one of the gate line and the light-blocking layer corresponding to the first pixel TFT when seen in the normal direction of the substrate, and
the other end, in the column direction, of the third electrode layer of the pixel electrode that is electrically connected to the first pixel TFT at least partially overlaps at least one of the gate line and the light-blocking layer corresponding to the second pixel TFT when seen in the normal direction of the substrate.

8. The active matrix substrate according to claim 1, wherein, in the first interlayer insulating layer, a source contact hole is formed so that at least a part of the source contact region of the oxide semiconductor layer is exposed,
wherein the source electrode is formed on the first interlayer insulating layer and in the source contact hole, and
wherein the active matrix substrate further includes a second interlayer insulating layer that is located between the first interlayer insulating layer and the first organic insulating layer and covers the source electrode.

9. The active matrix substrate according to claim 1, wherein the oxide semiconductor layer includes an In—Ga—Zn—O-based semiconductor.

10. A liquid crystal display apparatus comprising:
the active matrix substrate according to claim 1;
a counter substrate that is provided so as to face the active matrix substrate; and
a liquid crystal layer that is provided between the active matrix substrate and the counter substrate.

11. A method of manufacturing the active matrix substrate according to claim 3, comprising:
a step (A) of forming the pixel TFT on the substrate;
a step (B) of forming the first electrode layer by depositing a first transparent conductive film after the step (A) and subsequently performing patterning of the first transparent conductive film;
a step (C) of forming the first organic insulating layer that covers the pixel TFT and the first electrode layer and has the second pixel contact hole;
a step (D) of depositing a second transparent conductive film on the first organic insulating layer and in the second pixel contact hole and subsequently performing patterning of the second transparent conductive film;
a step (E) of forming the second organic insulating layer so as to fill the second pixel contact hole after the step (D); and
a step (F) of forming the third electrode layer and the second electrode layer by, after depositing a third transparent conductive film on the second transparent conductive film, on the first organic insulating layer, and on the second organic insulating layer, performing patterning of the third transparent conductive film and additional patterning of the second transparent conductive film simultaneously.

\* \* \* \* \*